United States Patent
Oh et al.

(10) Patent No.: US 12,495,542 B2
(45) Date of Patent: Dec. 9, 2025

(54) SEMICONDUCTOR DEVICE AND METHOD FOR FABRICATING THE SAME

(71) Applicant: SK hynix Inc., Gyeonggi-do (KR)

(72) Inventors: Dong Yean Oh, Gyeonggi-do (KR); Jin Sun Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 431 days.

(21) Appl. No.: 18/324,159

(22) Filed: May 26, 2023

(65) Prior Publication Data
US 2024/0215227 A1    Jun. 27, 2024

(30) Foreign Application Priority Data
Dec. 22, 2022   (KR) .................. 10-2022-0181583

(51) Int. Cl.
H10B 12/00        (2023.01)

(52) U.S. Cl.
CPC ........... H10B 12/488 (2023.02); H10B 12/03 (2023.02); H10B 12/05 (2023.02)

(58) Field of Classification Search
CPC ...... H10B 12/03; H10B 12/482; H10B 12/48; H10B 12/053; H10B 12/02; H10B 12/30; H10B 12/05; H10B 12/033; H10B 12/34; H10D 30/031
See application file for complete search history.

(56) References Cited

U.S. PATENT DOCUMENTS

| | | | | |
|---|---|---|---|---|
| 6,319,731 | B1 * | 11/2001 | Kang | H10B 53/30 |
| | | | | 257/E21.664 |
| 2020/0279601 | A1 * | 9/2020 | Kim | G11C 11/4097 |
| 2020/0350315 | A1 * | 11/2020 | Son | H10B 12/05 |
| 2022/0005810 | A1 | 1/2022 | Kang et al. | |
| 2022/0157819 | A1 * | 5/2022 | Jung | H10B 12/05 |
| 2022/0173106 | A1 | 6/2022 | Choi et al. | |
| 2023/0164981 | A1 * | 5/2023 | Ryu | H10B 12/30 |
| | | | | 257/213 |

* cited by examiner

Primary Examiner — Yasser A Abdelaziz
(74) Attorney, Agent, or Firm — IP & T GROUP LLP

(57) ABSTRACT

A semiconductor device includes a horizontal layer spaced apart from a lower structure to extend in a direction parallel to the lower structure; a vertical conductive line extending in a direction perpendicular to the lower structure and coupled to a first-side end of the horizontal layer; a data storage element coupled to a second-side end of the horizontal layer; and a horizontal conductive line including a first horizontal conductive line and a second horizontal conductive line that are vertically asymmetrical with the horizontal layer interposed therebetween.

16 Claims, 13 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2022-0181583, filed on Dec. 22, 2022, which is incorporated herein by reference in its entirety.

BACKGROUND

1. Field

Embodiments of the present invention relate generally to a semiconductor device and, more particularly, to a semiconductor device including memory cells that are arranged in three dimensions, and a method for fabricating the same.

2. Description of the Related Art

Three-dimensional memory devices which include memory cells arranged in three dimensions have been suggested rather recently.

SUMMARY

The present invention is directed generally to a semiconductor device including highly integrated memory cells, and a method for fabricating the semiconductor device.

In accordance with an embodiment of the present invention, a semiconductor device includes: a horizontal layer spaced apart from a lower structure to extend in a direction parallel to the lower structure; a vertical conductive line extending in a direction perpendicular to the lower structure and coupled to a first-side end of the horizontal layer; a data storage element coupled to a second-side end of the horizontal layer; and a horizontal conductive line including a first horizontal conductive line and a second horizontal conductive line that are vertically asymmetrical with the horizontal layer interposed therebetween.

In accordance with another embodiment of the present invention, a method for fabricating a semiconductor device includes: forming a stack body in which a first dielectric layer, a first sacrificial layer, a semiconductor layer, a second sacrificial layer, and a second dielectric layer are sequentially stacked over a lower structure; forming a first opening by etching the stack body; forming an upper recess by recessing the second sacrificial layer from the first opening; forming a lower recess whose horizontal length is greater than a horizontal length of the upper recess by recessing the first sacrificial layer from the first opening; forming a first horizontal conductive line in the upper recess; and forming a second horizontal conductive line whose horizontal length is the same as a horizontal length of the first horizontal conductive line in the lower recess, wherein the first horizontal conductive line and the second horizontal conductive line are asymmetrical in a vertical direction with the semiconductor layer interposed therebetween.

In accordance with another embodiment of the present invention, a semiconductor device includes: a lower structure; and a memory cell array including a plurality of memory cells that are vertically stacked over the lower structure, wherein each of the memory cells includes: a horizontal layer spaced apart from the lower structure to extend in a direction parallel to the lower structure; a vertical conductive line extending in a direction perpendicular to the lower structure and coupled to a first-side end of the horizontal layer; a data storage element coupled to a second-side end of the horizontal layer; and a horizontal conductive line including a first horizontal conductive line and a second horizontal conductive line that are vertically asymmetrical with the horizontal layer interposed therebetween.

These and other features and advantages of the present invention will become understood from the following detailed description and drawings.

DETAILED DESCRIPTION

Figure 1:
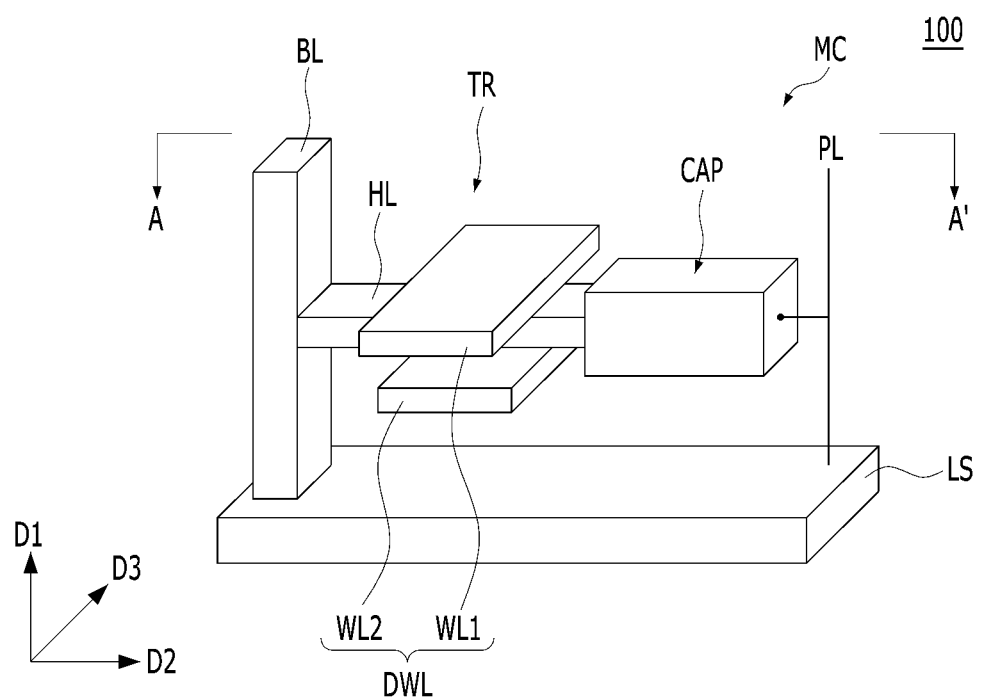
FIG. 1 is a simplified schematic perspective view illustrating a semiconductor device in accordance with an embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to an embodiment of the present invention described below, memory cells may be vertically stacked to increase memory cell density and reduce parasitic capacitance.

Figure 2A:
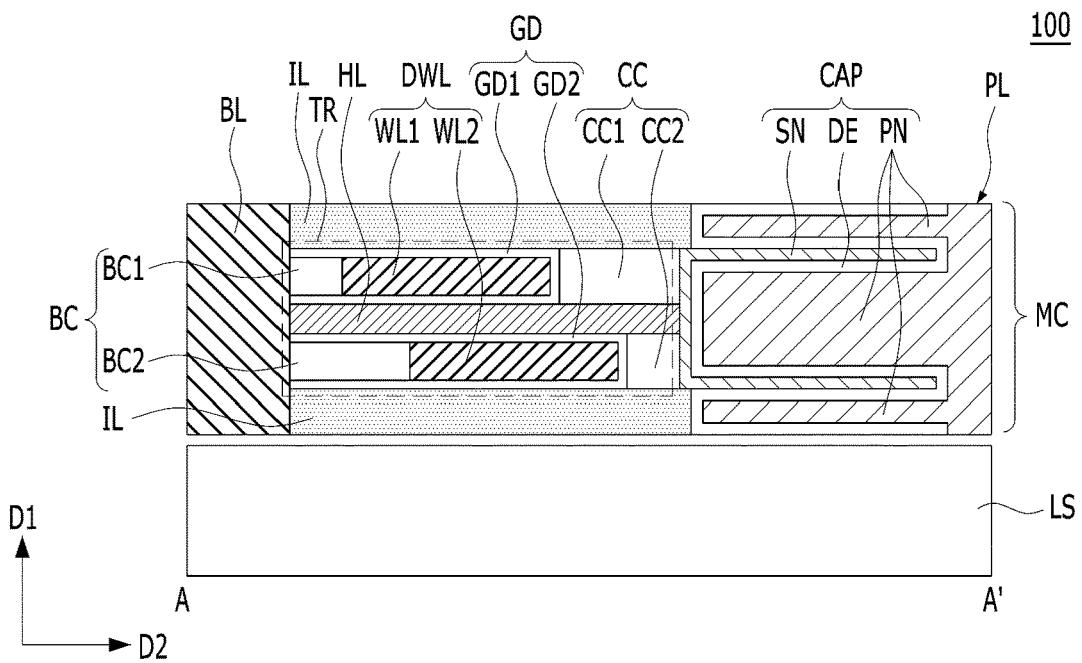
FIG. 2A is a simplified schematic cross-sectional view taken along a line A-A' shown in FIG. 1.
Figure 2B:
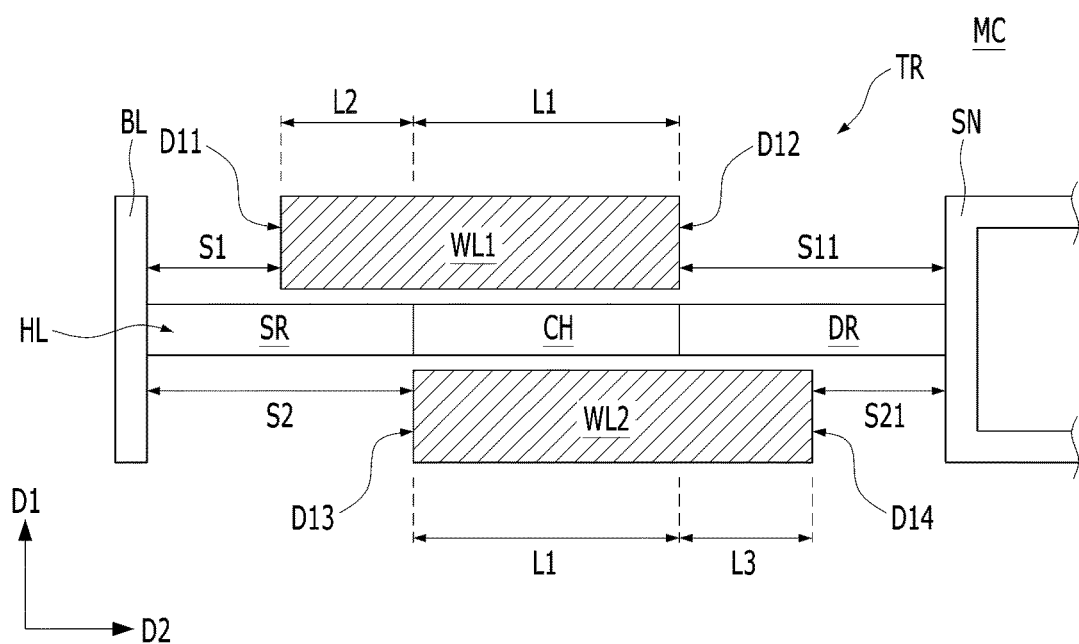
FIG. 2B is a detailed view illustrating a switching element shown in FIG. 2A.

FIG. 1 is a simplified schematic perspective view illustrating a semiconductor device in accordance with an embodiment of the present invention. FIG. 2A is a simplified schematic cross-sectional view taken along a line A-A' shown in FIG. 1. FIG. 2B is a detailed view illustrating a switching element shown in FIG. 2A.

Referring to FIGS. 1 to 2B, the semiconductor device 100 may include a lower structure LS and a memory cell MC. In an embodiment, the memory cell MC may be disposed over the lower structure LS as illustrated in FIG. 1. The memory cell MC may include a vertical conductive line BL, a switching element TR, and a data storage element CAP. The switching element TR may include a horizontal layer HL, a liner layer GD, and a horizontal conductive line DWL. The data storage element CAP may include a memory element, such as a capacitor. The vertical conductive line BL may include, for example, a bit line. The horizontal conductive line DWL may include, for example, a word line, and the horizontal layer HL may include, for example, an active layer. The data storage element CAP may include a first electrode SN, a dielectric layer DE, and a second electrode PN. The switching element TR may include, for example, a transistor, and in this case, the horizontal conductive line DWL may serve as a gate electrode. The switching element TR may also be referred to as an access element or a selection element.

The vertical conductive line BL may extend vertically in the first direction D1. The horizontal layer HL may extend horizontally (or laterally) in a second direction D2 intersecting with the first direction D1. The horizontal conductive line DWL may extend in a third direction D3 intersecting with the first and second directions D1 and D2. In an embodiment, the first, second, and third directions D1, D2, and D3 may be orthogonal to each other.

The vertical conductive line BL may be vertically oriented in the first direction D1. The vertical conductive line BL may be referred to as a vertically-oriented bit line, a vertically-extended bit line, or a pillar-shaped bit line. The vertical conductive line BL may include a conductive material such as, for example, a silicon-based material, a metal-based material, or a combination thereof. In some embodiments, the vertical conductive line BL may include polysilicon, a metal, a metal nitride, a metal silicide, or a combination thereof. In some embodiments, the vertical conductive line BL may include polysilicon, titanium nitride, tungsten, or a combination thereof. For example, the vertical conductive line BL may include polysilicon or titanium nitride (TiN) which is doped with an N-type impurity. In some embodiments, the vertical conductive line BL may include a stack of titanium nitride and tungsten (TiN/W).

The switching element TR may include a transistor, and thus, the horizontal conductive line DWL may be referred to as a gate or word line. The horizontal conductive line DWL may extend in the third direction D3, and the horizontal layer HL may extend in the second direction D2. The horizontal layer HL may be horizontally arranged with respect to the vertical conductive line BL. The horizontal conductive line DWL may have a double structure. For example, the horizontal conductive line DWL may include first and second horizontal conductive lines WL1 and WL2 that are facing each other with the horizontal layer HL interposed therebetween. A liner layer GD may be formed on the upper and lower surfaces of the horizontal layer HL. A first horizontal conductive line WL1 may be disposed over the horizontal layer HL, and a second horizontal conductive line WL2 may be disposed below the horizontal layer HL. The horizontal conductive line DWL may include a pair of a first horizontal conductive line WL1 and a second horizontal conductive line WL2. The horizontal conductive line DWL may be referred to as a double word line or a double gate. In the horizontal conductive line DWL, the first horizontal conductive line WL1 and the second horizontal conductive line WL2 may have the same potential. For example, the first horizontal conductive line WL1 and the second horizontal conductive line WL2 may form a pair to be coupled to one memory cell MC. The same driving voltage may be applied to the first horizontal conductive line WL1 and the second horizontal conductive line WL2.

The horizontal layer HL may extend in the second direction D2. The horizontal layer HL may include a semiconductor material. For example, the horizontal layer HL may include polysilicon, monocrystalline silicon, germanium, or silicon-germanium. According to another embodiment of the present invention, the horizontal layer HL may include an oxide semiconductor material. For example, the oxide semiconductor material may include indium gallium zinc oxide (IGZO).

The upper and lower surfaces of the horizontal layer HL may have flat surfaces. In other words, the upper and lower surfaces of the horizontal layer HL may be parallel to each other in the second direction D2. In an embodiment, the third and second directions D3 and D2 may be parallel to the top surface of the lower structure LS.

The horizontal layer HL may include a channel CH, a first doped region SR disposed between the channel CH and the vertical conductive line BL, and a second doped region DR disposed between the channel CH and the data storage element CAP. When the horizontal layer HL is formed of an oxide semiconductor material, the channel may be formed of an oxide semiconductor material, and the first and second doped regions may be omitted. The horizontal layer HL may also be referred to as an active layer or a thin-body layer.

The liner layer GD may serve as a gate dielectric layer. In some embodiments, the liner layer GD may include silicon oxide, silicon nitride, a metal oxide, a metal oxynitride, a metal silicate, a high-k material, ferroelectric material, anti-ferroelectric material, or a combination thereof. In some embodiments, the liner layer GD may include $SiO_2$, $Si_3N_4$, $HfO_2$, $Al_2O_3$, $ZrO_2$, AlON, HfON, HfSiO, HfSiON, or a combination thereof. In some embodiments, the liner layer GD may include a first liner layer GD1 and a second liner layer GD2. The horizontal length of the first liner layer GD1 in the second direction D2 may be smaller than that of the second liner layer GD2. The first liner layer GD1 may partially cover the first horizontal conductive line WL1, and the second liner layer GD2 may partially cover the second horizontal conductive line WL2. The first liner layer GD1 and the second liner layer GD2 may have a cup shape, such as a ⊃ shape. In an embodiment, the first liner layer GD1 and the second liner layer GD2 may have a rectangular shape with the side touching the vertical conductive line BL being open.

The horizontal conductive line DWL may include a metal-based material, a semiconductor material, or a combination thereof. In some embodiments, the horizontal conductive line DWL may include titanium nitride, tungsten, polysilicon, or a combination thereof. For example, the horizontal conductive line DWL may include a TiN/W stack in which titanium nitride and tungsten are sequentially stacked. The horizontal conductive line DWL may include an N-type work function material or a P-type work function material. The N-type work function material may have a low work function of approximately 4.5 eV or less, and the P-type work function material may have a high work function of approximately 4.5 eV or more.

The data storage element CAP may be horizontally disposed in the second direction D2 from the switching element TR. The data storage element CAP may include a first electrode SN extending horizontally from the horizontal layer HL in the second direction D2. The data storage element CAP may further include a second electrode PN over the first electrode SN, and a dielectric layer DE between the first electrode SN and the second electrode PN. The first electrode SN, the dielectric layer DE, and the second electrode PN may be horizontally arranged in the second direction D2. The first electrode SN may have a horizontally oriented cylinder-shape. The dielectric layer DE may conformally cover the inner wall and the outer wall of the cylinder of the first electrode SN. The second electrode PN may cover a cylinder inner wall and a cylinder outer wall of the first electrode SN over the dielectric layer DE. The first electrode SN may be electrically connected to the second source/drain region DR.

The first electrode SN may have a three-dimensional structure, and the first electrode SN of the three-dimensional structure may have a horizontal three-dimensional structure which is oriented in the second direction D2. As an example of the three-dimensional structure, the first electrode SN may have a cylinder shape. According to another embodiment of the present invention, the first electrode SN may have a pillar shape or a pylinder shape. The pylinder shape may refer to a structure in which a pillar shape and a cylinder shape are merged.

The first electrode SN and the second electrode PN may include a metal, a noble metal, a metal nitride, a conductive metal oxide, a conductive noble metal oxide, a metal carbide, a metal silicide, or a combination thereof. For example, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack. The second electrode PN may include a combination of a metal-based material and a silicon-based material. For example, the second electrode PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the first electrode SN, and titanium nitride (TiN) may serve as a second electrode PN of a data storage element CAP, and tungsten nitride may be a low-resistance material.

The dielectric layer DE may be referred to as a capacitor dielectric layer or a memory layer. The dielectric layer DE may include, for example, silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, an interface control layer for improving leakage current may be further formed between the first electrode SN and the dielectric layer DE. The interface control layer may include titanium oxide ($TiO_2$), tantalum oxide ($Ta_2O_5$), niobium oxide ($Nb_2O_5$). The interface control layer may also be formed between the second electrode PN and the dielectric layer DE.

The data storage element CAP may include a metal-insulator-metal (MIM) capacitor. The first electrode SN and the second electrode PN may include a metal-based material.

The data storage element CAP may be replaced with another data storage material. For example, the data storage material may be a phase change material, a magnetic tunnel junction (MTJ), or a variable resistance material.

Referring back to FIGS. 1 to 2B, the horizontal conductive line DWL may include first to fourth side surfaces D11 to D14. The first side surface D11 and the second side surface D12 of the horizontal conductive line DWL may be disposed at a higher level than the horizontal layer HL, and the third side surface D13 and the fourth side surface D14 of the horizontal conductive line DWL may be disposed at a lower level than the horizontal layer HL. The first side surface D11 and the second side surface D12 of the horizontal conductive line DWL may face each other in the second direction D2. The third side surface D13 and the fourth side surface D14 of the horizontal conductive line DWL may face each other in the second direction D2. The first and second side surfaces D11 and D12 of the horizontal conductive line DWL may be provided by the first horizontal conductive line WL1. The third and fourth side surfaces D13 and D14 of the horizontal conductive line DWL may be provided by the second horizontal conductive line WL2.

The first horizontal conductive line WL1 may include a first side surface D11 and a second side surface D12. The second horizontal conductive line WL2 may include a third side surface D13 and a fourth side surface D14. The first side surface D11 of the first horizontal conductive line WL1 may be disposed adjacent to the vertical conductive line BL, and the second side surface D12 of the first horizontal conductive line WL1 may be disposed adjacent to the first electrode SN of the data storage element CAP. The third side surface D13 of the second horizontal conductive line WL2 may be disposed adjacent to the vertical conductive line BL, and the fourth side surface D14 of the second horizontal conductive line WL2 may be disposed adjacent to the first electrode SN of the data storage element CAP. The first horizontal conductive line WL1 and the second horizontal conductive line WL2 may face each other in the first direction D1 and may have an asymmetrical structure with the horizontal layer HL interposed therebetween. The horizontal conductive line DWL may be referred to herein as a dual, asymmetrical horizontal conductive line DWL.

The first horizontal conductive line WL1 and the second horizontal conductive line WL2 may have the same horizontal length in the second direction D2. The first horizontal conductive line and the second horizontal conductive lines WL1 and WL2 may have the same vertical height in the first direction D1. The first horizontal conductive line WL1 may include a first overlap region L1 and a second overlap region L2 overlapping with the horizontal layer HL. The second horizontal conductive line WL2 may include a first overlap region L1 and a third overlap region L3 overlapping with the horizontal layer HL. In the first overlap region L1, the first horizontal conductive line WL1 and the second horizontal conductive line WL2 may overlap in common with the horizontal layer HL. In the second overlap region L2, the first horizontal conductive line WL1 and the horizontal layer HL may overlap. In the third overlap region L3, the second horizontal conductive line WL2 and the horizontal layer HL may overlap. In the second overlap region L2, the second horizontal conductive line WL2 and the horizontal layer HL may not overlap. In the third overlap region L3, the first horizontal conductive line WL1 and the horizontal layer HL may not overlap. A portion of the horizontal layer HL disposed in the first overlap region L1 may be referred to as a channel. The first overlap region L1 of the first horizontal conductive line WL1 and the first overlap region L1 of the second horizontal conductive line WL2 may overlap with the channel CH of the horizontal layer HL. The second overlap region L2 of the first horizontal conductive line WL1 may overlap with the first doped region SR of the horizontal layer HL, and the third overlap region L3 of the second horizontal conductive line WL2 may overlap with the second doped region DR of the horizontal layer HL.

The first horizontal conductive line WL1 may be closer to the vertical conductive line BL, and the second horizontal conductive line WL2 may be closer to the data storage element CAP. For example, the distance S1 between the first horizontal conductive line WL1 and the vertical conductive line BL may be shorter than the distance S11 between the first electrode SN of the data storage element CAP and the first horizontal conductive line WL1. The distance S21 between the first electrode SN of the data storage element CAP and the second horizontal conductive line WL2 may be shorter than the distance S2 between the second horizontal conductive line WL2 and the vertical conductive line BL. The distance S1 between the first side surface D11 of the first horizontal conductive line WL1 and the vertical conductive line BL may be shorter than the distance S11 between the first electrode SN of the data storage element CAP and the second side surface D12 of the first horizontal conductive line WL1. The distance S21 between the first electrode SN of the data storage element CAP and the fourth side surface D14 of the second horizontal conductive line WL2 may be shorter than the distance S2 between the third side surface D13 of the second horizontal conductive line WL2 and the vertical conductive line BL.

A first capping layer BC may be disposed between the vertical conductive line BL and the horizontal conductive line DWL, and a second capping layer CC may be disposed between the data storage element CAP and the horizontal conductive line DWL. The first capping layer BC may include an upper-level first capping layer BC1 and a lower-level first capping layer BC2. The second capping layer CC may include an upper-level second capping layer CC1 and a lower-level second capping layer CC2.

The upper-level first capping layer BC1 may be disposed between the first side surface D11 of the first horizontal conductive line WL1 and the vertical conductive line BL. The upper-level second capping layer CC1 may be disposed between the second side surface D12 of the first horizontal conductive line WL1 and the first electrode SN of the data storage element CAP. The lower-level first capping layer BC2 may be disposed between the third side surface D13 of the second horizontal conductive line WL2 and the vertical conductive line BL. The lower-level second capping layer CC2 may be disposed between the fourth side surface D14 of the second horizontal conductive line WL2 and the first electrode SN of the data storage element CAP.

The first and second capping layers BC and CC may include a dielectric material. The first and second capping layers BC and CC may include, for example, silicon oxide, silicon nitride, silicon carbon oxide, an air gap, or a combination thereof. The upper-level first capping layer BC1 and the lower-level first capping layer BC2 may be formed of the same material. The upper-level second capping layer CC1 and the lower-level second capping layer CC2 may be formed of the same material. In some embodiments, the upper-level first capping layer BC1 and the lower-level first capping layer BC2 may include silicon oxide, and the upper-level second capping layer CC1 and the lower-level second capping layer CC2 may include a stack of silicon oxide and silicon nitride. The horizontal length of the upper-level first capping layer BC1 in the second direction D2 may be smaller than the horizontal length of the lower-level first capping layer BC2. The horizontal length of the upper-level second capping layer CC1 in the second direction D2 may be greater than the horizontal length of the lower-level second capping layer CC2.

The first liner layer GD1 may cover the first horizontal conductive line WL1 and the upper-level first capping layer BC1. The second liner layer GD2 may cover the second horizontal conductive line WL2 and the lower-level first capping layer BC2. First-side surfaces of the upper-level first capping layer BC1 and the lower-level first capping layer BC2 may contact or directly contact the first and second horizontal conductive lines WL1 and WL2. Second-side surfaces of the upper-level first capping layer BC1 and the lower-level first capping layer BC2 may contact or directly contact the vertical conductive line BL while being non-covered by the first and second liner layers GD1 and GD2. The first and second liner layers GD1 and GD2 may be disposed between the first and second horizontal conductive lines WL1 and WL2 and the second capping layer CC. The first and second liner layers GD1 and GD2 may have a horizontally oriented cup shape.

As described above, the memory cell MC may include a horizontal conductive line DWL having an asymmetric structure of the first and second horizontal conductive lines WL1 and WL2. The horizontal conductive line DWL having an asymmetric structure of the first and second horizontal conductive lines WL1 and WL2 may reduce gate controllability, thereby improving an electric field.

Also, since the potential barrier of the first overlap region L1 is maintained, a change in the switching element characteristics, such as a change in the threshold voltage may be minimized.

The horizontal conductive line DWL including the first and second horizontal conductive lines WL1 and WL2 of the asymmetric structure may be able to satisfy a sufficiently high threshold voltage and a low leakage current simultaneously.

As the first and second horizontal conductive lines WL1 and WL2 of the asymmetric structure are formed, the electric field formed at the ends of both sides of the horizontal conductive line DWL may be reduced, thereby improving leakage current. Also, since each of the first horizontal conductive line WL1 and the second horizontal conductive line WL2 includes the first overlap region L1 that commonly overlaps with the horizontal layer HL, it is possible to form a high threshold voltage based on a high work function. Also, since the height of the memory cell MC may be reduced by forming a low electric field, it is advantageous in terms of integration.

As Comparative Example 1, when the first horizontal conductive line WL1 and the second horizontal conductive line WL2 are formed in a symmetrical structure, a strong electric field may be formed in both of the first horizontal conductive line WL1 and the second horizontal conductive line WL2, which may lead to increased leakage current.

As Comparative Example 2, when the first and second horizontal conductive lines WL1 and WL2 are formed of a metal-based material alone in a symmetrical structure, a high electric field may be formed between the first and second horizontal conductive lines WL1 and WL2 and the data storage element CAP due to a high work function of the metal-based material, which degrades the leakage current of the memory cell MC.

As Comparative Example 3, when the distance between the horizontal conductive line DWL and the vertical conductive line BL and the distance between the horizontal conductive line DWL and the data storage element CAP increase, the electric field degradation may be improved. However, since the cell size of the memory cell may be increased, there may be a change in the characteristics of the switching element TR.

According to the embodiment of the present invention, it is possible to suppress an increase in the leakage current due to the presence of a strong electric field and an increase in the size of the memory cell MC by forming the horizontal conductive line DWL including the first and second horizontal conductive lines WL1 and WL2 of the asymmetric structure.

According to the embodiment of the present invention, since the horizontal conductive line DWL includes the first and second horizontal conductive lines WL1 and WL2 of the asymmetric structure, leakage current may be improved and thus the refresh characteristics of the memory cell MC may be improved, which makes it possible to reduce power consumption.

Also, according to the embodiment of the present invention, since the horizontal conductive line DWL includes the first and second horizontal conductive lines WL1 and WL2 of the asymmetric structure, even though the thickness of the horizontal layer HL is reduced for the purpose of high integration, it is relatively advantageous to increasing the electric field. Therefore, a high number of stacked layers may be realized.

Figure 3A:
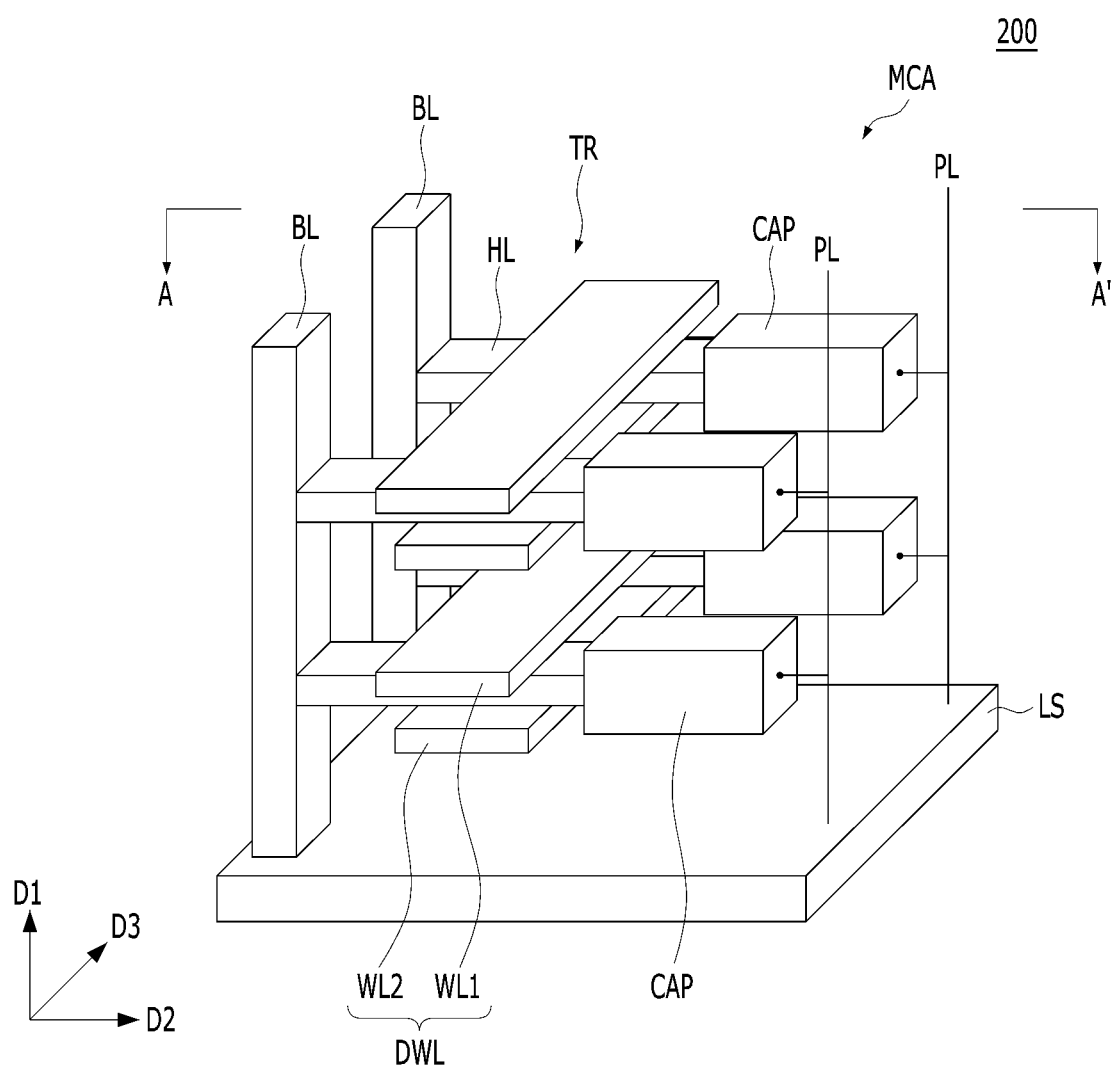
FIG. 3A is a simplified schematic perspective view illustrating a semiconductor device in accordance with another embodiment of the present invention.
Figure 3B:
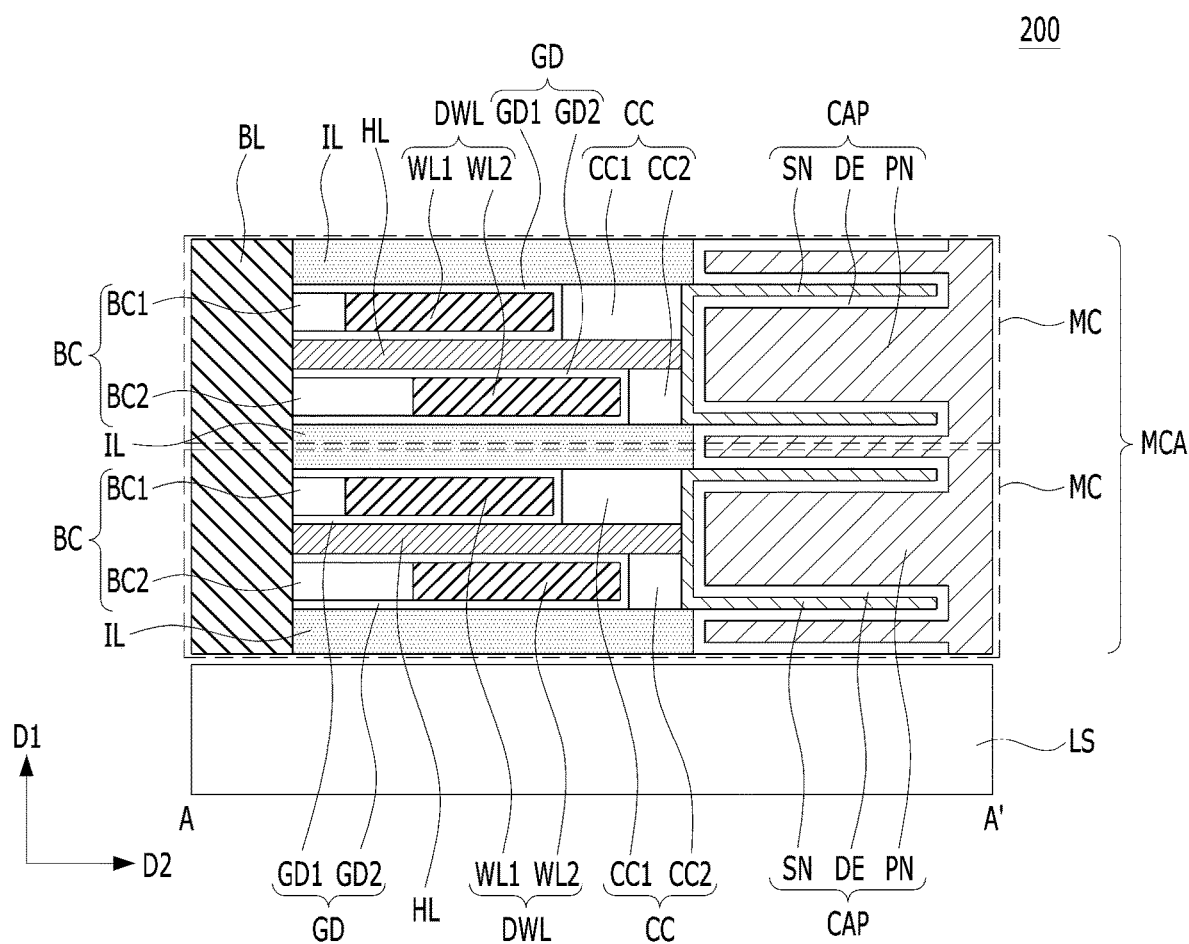
FIG. 3B is a simplified schematic cross-sectional view taken along a line A-A' shown in FIG. 3A.

FIG. 3A is a simplified schematic perspective view of a semiconductor device 200 in accordance with another embodiment of the present invention. FIG. 3B is a simplified schematic cross-sectional view taken along a line A-A' shown in FIG. 3A.

Referring to FIGS. 3A and 3B, the semiconductor device 200 may include a lower structure LS and a memory cell array MCA disposed over the lower structure LS. The memory cell array MCA may include a 3D array of memory cells MC. The 3D array of the memory cells MC may include a column array of memory cells MC and a row array of memory cells MC. The column array of the memory cells MC may include a plurality of memory cells MC that are stacked in the first direction D1, and the row array of the memory cells MC may include a plurality of memory cells MC that are horizontally disposed in the third direction D3. According to some embodiments of the present invention, cell dielectric layers IL may be disposed between the memory cells MC that are stacked in the first direction D1. The memory cell MC shown in FIGS. 3A and 3B may correspond to the memory cell MC shown in FIGS. 1 to 2B. Accordingly, the memory cell array MCA may include a three-dimensional array of memory cells MC that is described in FIGS. 1 to 2B. Hereinafter, detailed descriptions on the constituent elements of FIGS. 3A and 3B also appearing in FIGS. 1 to 2B will be omitted.

Referring back to FIGS. 1 to 3B, each memory cell MC may include a vertical conductive line BL, a switching element TR, and a data storage element CAP. Each switching element TR may be a transistor and it may include a horizontal layer HL, a liner layer GD, and a horizontal conductive line DWL. As illustrated in FIG. 2B, each of the horizontal layers HL may include a first doped region SR, a second doped region DR, and a channel CH between the first doped region SR and the second doped region DR. Each horizontal conductive line DWL may include a pair of asymmetrical first and second horizontal conductive lines WL1 and WL2.

The column array of the memory cells MC may include a plurality of switching elements TR that are stacked in the first direction D1, and the row array of the memory cells MC may include a plurality of switching elements TR that are disposed horizontally in the third direction D3.

The horizontal layers HL may be stacked over the lower structure LS in the first direction D1, and the horizontal layers HL may be spaced apart from the lower structure LS to extend in the second direction D2 which is parallel to the surface lower the lower structure LS.

The vertical conductive line BL may extend in the first direction D1 which is perpendicular to the surface of the lower structure LS to be coupled to first-side ends of the horizontal layers HL.

The data storage elements CAP may be coupled to second-side ends of the horizontal layers HL, respectively.

The horizontal conductive lines DWL may be stacked in the first direction D1 over the lower structure LS, and the horizontal conductive lines DWL may be spaced apart from the lower structure LS to extend in the third direction D3 which is parallel to the surface of the lower the lower structure LS.

The second electrodes PN of the data storage elements CAP may be coupled to a common plate PL. The horizontal layers HL of the switching elements TR disposed horizontally in the third direction D3 may share one horizontal conductive line DWL. The horizontal layers HL of the switching elements TR that are disposed horizontally in the third direction D3 may be coupled to different vertical conductive lines BL. The switching elements TR that are stacked in the first direction D1 may share one vertical conductive line BL. The switching elements TR disposed horizontally in the third direction D3 may share one horizontal conductive line DWL.

The lower structure LS may include a semiconductor substrate or a peripheral circuit portion. The lower structure LS may be disposed at a lower level than the memory cell array MCA. This may be referred to as a COP (Cell-Over-Peripheral) structure. The peripheral circuit portion may include at least one control circuit for driving the memory cell array MCA. The at least one control circuit of the peripheral circuit portion may include an N-channel transistor, a P-channel transistor, a CMOS circuit, or a combination thereof. The at least one control circuit of the peripheral circuit portion may include an address decoder circuit, a read circuit, a write circuit, and the like. The at least one control circuit of the peripheral circuit portion may include a planar channel transistor, a recess channel transistor, a buried gate transistor, a fin channel transistor (FinFET), and the like.

For example, the peripheral circuit portion may include sub-word line drivers and a sense amplifier. The horizontal conductive lines DWL may be coupled to sub-word line drivers. The vertical conductive line BL may be coupled to the sense amplifier.

According to another embodiment of the present invention, the peripheral circuit portion may be disposed at a higher level than the memory cell array MCA. This may be referred to as a POC (Peripheral-Over-Cell) structure.

The memory cell array MCA may include horizontal conductive lines DWL that are stacked in the first direction D1. Each of the horizontal conductive lines DWL may include a pair of a first horizontal conductive line WL1 and a second horizontal conductive line WL2.

As described above, each of the horizontal conductive lines DWL of the memory cell array MCA may include first and second horizontal conductive lines WL1 and WL2 of an asymmetrical structure. As for the description on the first and second horizontal conductive lines WL1 and WL2 of the asymmetric structure, FIGS. 1 to 2B may be referred to.

Figure 4A:
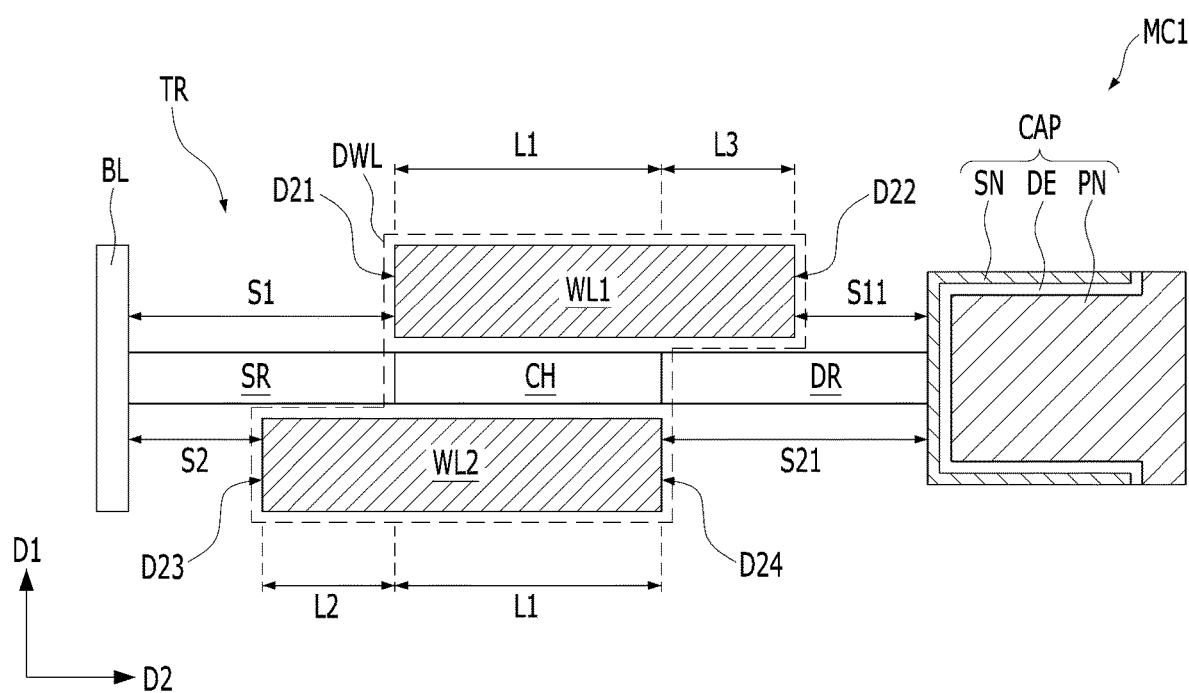
FIG. 4A is a simplified schematic cross-sectional view illustrating a memory cell in accordance with another embodiment of the present invention.

FIG. 4A is a simplified schematic cross-sectional view illustrating a memory cell in accordance with another embodiment of the present invention.

Referring to FIG. 4A, the memory cell MC1 may include a vertical conductive line BL, a switching element TR, and a data storage element CAP. The switching element TR may include a horizontal conductive line DWL and a horizontal layer HL. The horizontal conductive line DWL may have a double structure of a first horizontal conductive line WL1 and a second horizontal conductive line WL2. The horizontal layer HL may include a first doped region SR, a second doped region DR, and a channel CH.

The first horizontal conductive line WL1 may be disposed at a higher level than the horizontal layer HL, and the second horizontal conductive line WL2 may be disposed at a lower level than the horizontal layer HL.

The horizontal conductive line DWL may include first to fourth side surfaces D21 to D24. The first side surface D21 and the second side surface D22 of the horizontal conductive line DWL may be disposed at a higher level than the horizontal layer HL, and the third side surface D23 and the fourth side surface D24 of the horizontal conductive line DWL may be disposed at a lower level than the horizontal layer HL. The first side surface D21 and the second side surface D22 of the horizontal conductive line DWL may face each other in the second direction D2. The third side surface D23 and the fourth side surface D24 of the horizontal conductive line DWL may face each other in the second direction D2. The first side surface D21 and the second side surface D22 of the horizontal conductive line DWL may be provided by the first horizontal conductive line WL1. The third side surface D23 and the fourth side surface D24 of the horizontal conductive line DWL may be provided by the second horizontal conductive line WL2.

The first horizontal conductive line WL1 may include a first side surface D21 and a second side surface D22. The second horizontal conductive line WL2 may include a third side surface D23 and a fourth side surface D24. The first side surface D21 of the first horizontal conductive line WL1 may be disposed adjacent to the vertical conductive line BL, and the second side surface D22 of the first horizontal conductive line WL1 may be disposed adjacent to the first electrode SN of the data storage element CAP. The third side surface D23 of the second horizontal conductive line WL2 may be disposed adjacent to the vertical conductive line BL, and the fourth side surface D24 of the second horizontal conductive line WL2 may be disposed adjacent to the first electrode SN of the data storage element CAP. The first horizontal conductive line WL1 and the second horizontal conductive line WL2 may face each other in the first direction D1 and have an asymmetrical structure with the horizontal layer HL interposed therebetween.

The first horizontal conductive line WL1 and the second horizontal conductive line WL2 may have the same horizontal length in the second direction D2. The first horizontal conductive line WL1 and the second horizontal conductive lines WL1 and WL2 may have the same vertical height in the first direction D1. The first horizontal conductive line WL1 may include a first overlap region L1 and a second overlap region L3 overlapping with the horizontal layer HL. The second horizontal conductive line WL2 may include a first overlap region L1 and a third overlap region L2 overlapping with the horizontal layer HL. In the first overlap region L1, the first horizontal conductive line WL1 and the second horizontal conductive line WL2 may overlap in common with the horizontal layer HL. In the second overlap region L3, the first horizontal conductive line WL1 and the horizontal layer HL may overlap. In the third overlap region L2, the second horizontal conductive line WL2 and the horizontal layer HL may overlap. The second horizontal conductive line WL2 and the horizontal layer HL may not overlap in the second overlap region L21, and the first horizontal conductive line WL1 and the horizontal layer HL may not overlap in the third overlap region L31. A portion of the horizontal layer HL disposed in the first overlap region L1 may be referred to as a channel. The first overlap region L1 of the first horizontal conductive line WL1 and the first overlap region L1 of the second horizontal conductive line WL2 may overlap with the channel CH of the horizontal layer HL. The second overlap region L3 of the first horizontal conductive line WL1 may overlap with the second doped region DR of the horizontal layer HL, and the third overlap region L2 of the second horizontal conductive line WL2 may overlap with the first doped region SR of the horizontal layer HL.

The first horizontal conductive line WL1 may be closer to the data storage element CAP, and the second horizontal conductive line WL2 may be closer to the vertical conductive line BL. For example, the distance S1 between the first horizontal conductive line WL1 and the vertical conductive line BL may be greater than the distance S11 between the first electrode SN of the data storage element CAP and the first horizontal conductive line WL1. The distance S21 between the first electrode SN of the data storage element CAP and the second horizontal conductive line WL2 may be greater than the distance S2 between the second horizontal conductive line WL2 and the vertical conductive line BL. The distance S1 between the first side surface D21 of the first horizontal conductive line WL1 and the vertical conductive line BL may be greater than the distance S11 between the first electrode SN of the data storage element CAP and the second side surface D22 of the first horizontal conductive line WL1. The distance S21 between the first electrode SN of the data storage element CAP and the fourth side surface D24 of the second horizontal conductive line WL2 may be greater than the distance S2 between the third side surface D23 of the second horizontal conductive line WL2 and the vertical conductive line BL.

Figure 4B:
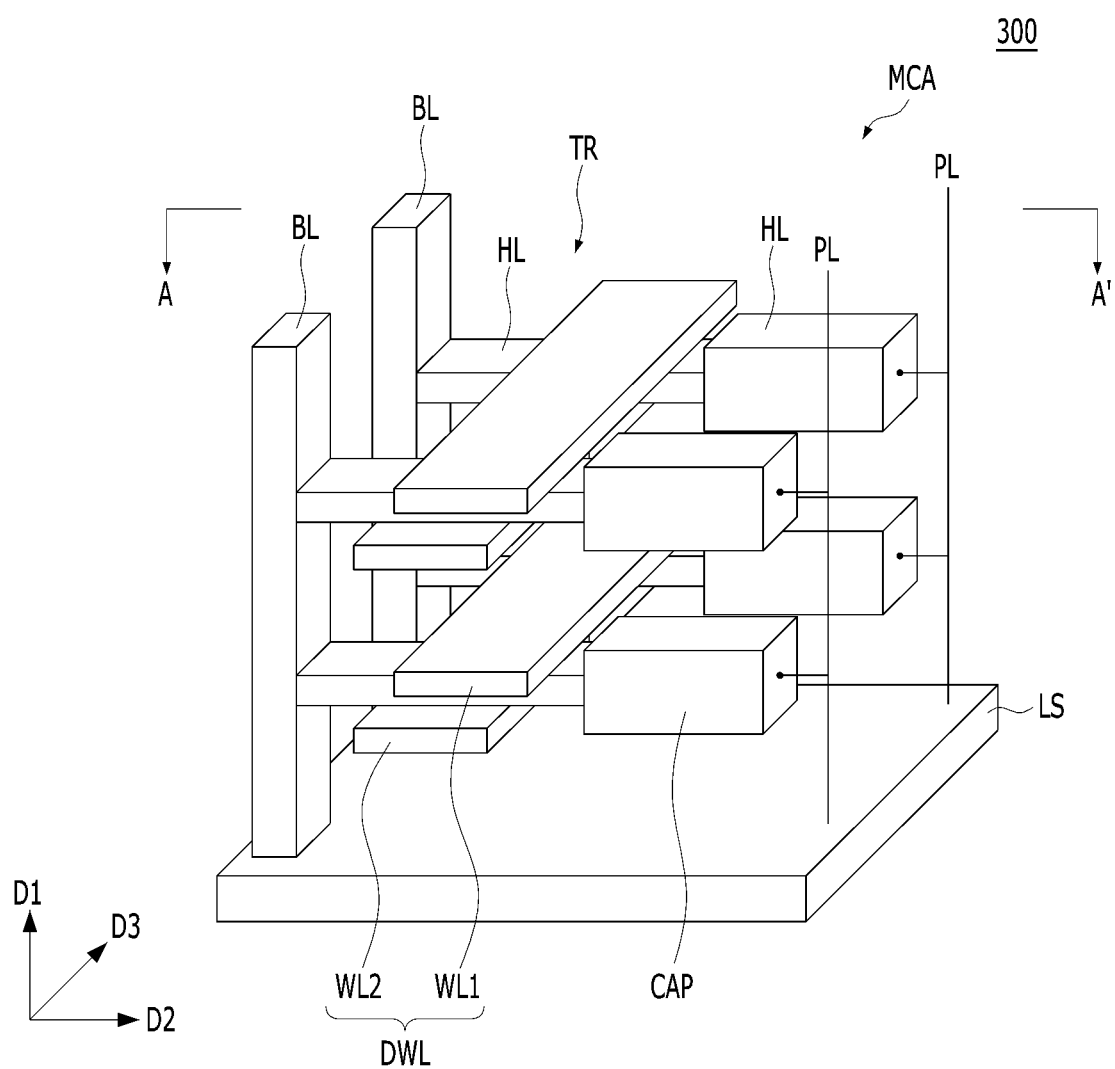
FIG. 4B is a simplified schematic perspective view illustrating a semiconductor device including the memory cell shown in FIG. 4A.
Figure 4C:
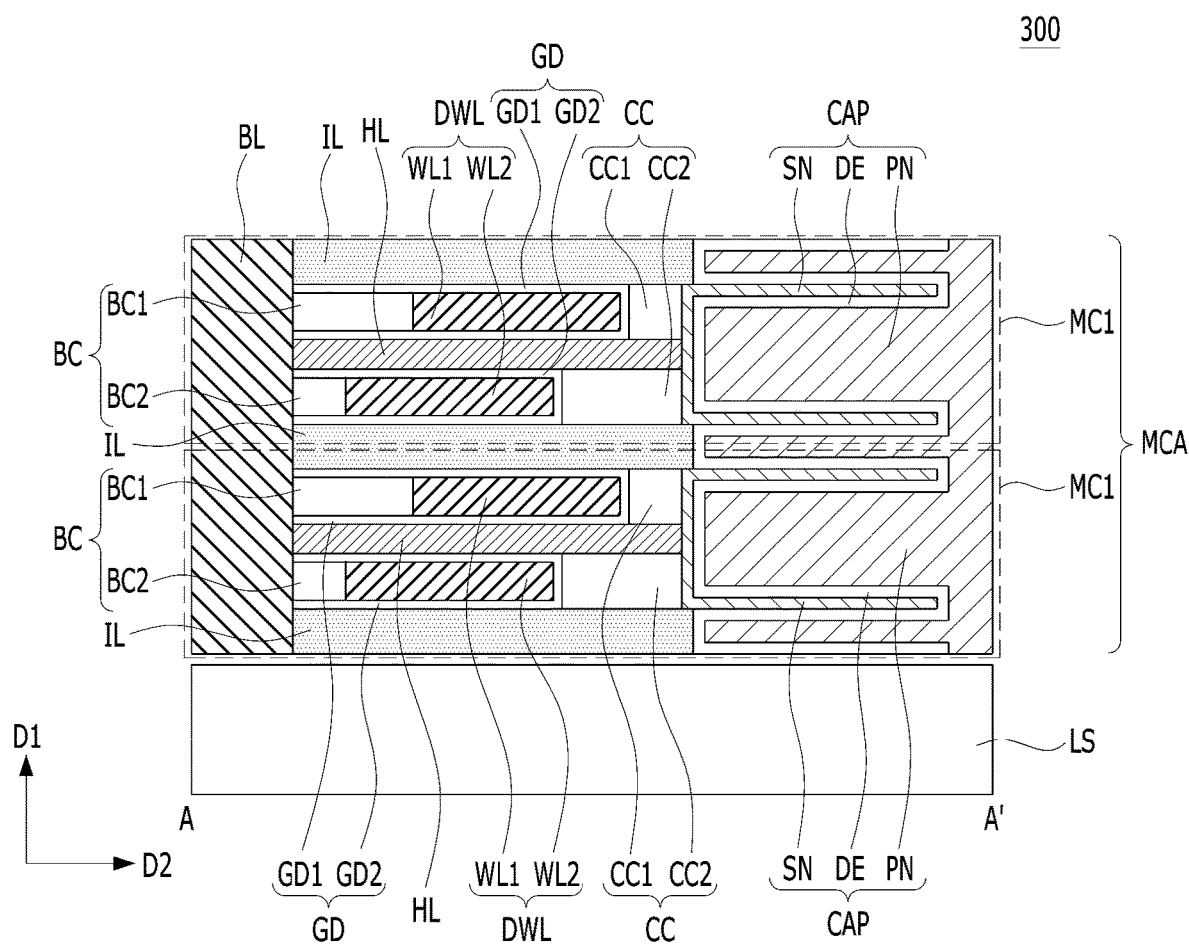
FIG. 4C is a simplified schematic cross-sectional view taken along a line A-A' shown in FIG. 4B.

FIG. 4B is a simplified schematic perspective view illustrating a semiconductor device 300 including the memory cells MC1 shown in FIG. 4A. FIG. 4C is a simplified schematic cross-sectional view taken along a line A-A' shown in FIG. 4B.

Referring to FIGS. 4A, 4B, and 4C, the semiconductor device 300 may include a lower structure LS and a memory cell array MCA. The memory cell array MCA may include a 3D array of memory cells MC1. The 3D array of the memory cells MC1 may include a column array of memory cells MC1 and a row array of memory cells MC1. The column array of the memory cells MC1 may include a plurality of memory cells MC that are stacked in the first direction D1, and the row array of the memory cells MC may include a plurality of memory cells MC that are horizontally disposed in the third direction D3. According to some embodiments of the present invention, cell dielectric layers IL may be disposed between the memory cells MC1 that are stacked in the first direction D1.

Each of the memory cells MC1 may include a vertical conductive line BL, a switching element TR, and a data storage element CAP. Each switching element TR may be a transistor, and each switching element TR may include a horizontal layer HL, a liner layer GD, and a horizontal conductive line DWL. Each horizontal layer HL may include a first doped region SR, a second doped region DR, and a channel CH between the first doped region SR and the second doped region DR. Each horizontal conductive line DWL may include a pair of a first horizontal conductive line WL1 and a second horizontal conductive line WL2.

The column array of the memory cells MC1 may include a plurality of switching elements TR that are stacked in the first direction D1, and the row array of the memory cells MC1 may include a plurality of switching elements TR that are disposed horizontally in the third direction D3.

The horizontal layers HL may be stacked over the lower structure LS in the first direction D1, and the horizontal layers HL may be spaced apart from the lower structure LS to extend in the second direction D1, which is parallel to the surface of the lower structure LS.

The vertical conductive line BL may extend in the first direction D1, which is perpendicular to the surface of the lower structure LS, and may be coupled to first-side ends of the horizontal layers HL.

The data storage elements CAP may be coupled to second-side ends of the horizontal layers HL, respectively.

The horizontal conductive lines DWL may be stacked over the lower structure LS in the first direction D1, and the horizontal conductive lines DWL may be spaced apart from the lower structure LS to extend in the third direction D3, which is parallel to the surface of the lower structure LS.

The second electrodes PN of the data storage elements CAP may be coupled to the common plate PL. The horizontal layers HL of the switching elements TR that are disposed horizontally in the third direction D3 may share one horizontal conductive line DWL. The horizontal layers HL of the switching elements TR that are disposed horizontally in the third direction D3 may be coupled to different vertical conductive lines BL. The switching elements TR stacked in the first direction D1 may share one vertical conductive line BL. The switching elements TR disposed horizontally in the third direction D3 may share one horizontal conductive line DWL.

The lower structure LS may include a semiconductor substrate or a peripheral circuit portion. The lower structure LS may be disposed at a lower level than the memory cell array MCA. This may be referred to as a COP (Cell-Over-Peripheral) structure. The peripheral circuit portion may include at least one control circuit for driving the memory cell array MCA. The at least one control circuit of the peripheral circuit portion may include an N-channel transistor, a P-channel transistor, a CMOS circuit, or a combination thereof. The at least one control circuit of the peripheral circuit portion may include an address decoder circuit, a read circuit, a write circuit, and the like. The at least one control circuit of the peripheral circuit portion may include a planar channel transistor, a recess channel transistor, a buried gate transistor, a fin channel transistor (FinFET), and the like.

For example, the peripheral circuit portion may include sub-word line drivers and a sense amplifier. The horizontal conductive lines DWL may be coupled to the sub-word line drivers. The vertical conductive line BL may be coupled to the sense amplifier.

According to another embodiment of the present invention, the peripheral circuit portion may be disposed at a higher level than the memory cell array MCA. This may be referred to as a POC (Peripheral-Over-Cell) structure.

The memory cell array MCA may include horizontal conductive lines DWL that are stacked in the first direction D1. Each of the horizontal conductive lines DWL may include a pair of a first horizontal conductive line WL1 and a second horizontal conductive line WL2.

A first capping layer BC may be disposed between the vertical conductive line BL and the horizontal conductive line DWL, and a second capping layer CC may be disposed between the data storage element CAP and the horizontal conductive line DWL. The first capping layer BC may include an upper-level first capping layer BC1 and a lower-level first capping layer BC2. The second capping layer CC may include an upper-level second capping layer CC1 and a lower-level second capping layer CC2.

The upper-level first capping layer BC1 may be disposed between the first side surface D21 of the first horizontal conductive line WL1 and the vertical conductive line BL. The upper-level second capping layer CC1 may be disposed between the second side surface D22 of the first horizontal conductive line WL1 and the first electrode SN of the data storage element CAP. The lower-level first capping layer BC2 may be disposed between the third side surface D23 of the second horizontal conductive line WL2 and the vertical conductive line BL. The lower-level second capping layer CC2 may be disposed between the fourth side surface D24 of the second horizontal conductive line WL2 and the first electrode SN of the data storage element CAP.

The first and second capping layers BC and CC may include a dielectric material. The first and second capping layers BC and CC may include, for example, silicon oxide, silicon nitride, silicon carbon oxide, an air gap, or a combination thereof. The upper-level first capping layer BC1 and the lower-level first capping layer BC2 may be formed of the same material. The upper-level second capping layer CC1 and the lower-level second capping layer CC2 may be formed of the same material. The upper-level first capping layer BC1 and the lower-level first capping layer BC2 may include, for example, silicon oxide, and the upper-level second capping layer CC1 and the lower-level second capping layer CC2 may include a stack of silicon oxide and silicon nitride. The horizontal length of the upper-level first capping layer BC1 in the second direction D2 may be greater than the horizontal length of the lower-level first capping layer BC2. The horizontal length of the upper-level second capping layer CC1 in the second direction D2 may be smaller than the horizontal length of the lower-level second capping layer CC2.

The first liner layer GD1 may cover the first horizontal conductive line WL1 and the upper-level first capping layer BC1. The second liner layer GD2 may cover the second horizontal conductive line WL2 and the lower-level first capping layer BC2. First-side surfaces of the upper-level first capping layer BC1 and the lower-level first capping layer BC2 may contact or directly contact the first and second horizontal conductive lines WL1 and WL2. Second-side surfaces of the upper-level first capping layer BC1 and the lower-level first capping layer BC2 may contact or directly contact the vertical conductive line BL while being non-covered by the first and second liner layers GD1 and GD2. The first and second liner layers GD1 and GD2 may be disposed between the first and second horizontal conductive lines WL1 and WL2 and the second capping layer CC. The first and second liner layers GD1 and GD2 may have a horizontally oriented cup shape.

As described above, each of the horizontal conductive lines DWL of the memory cell array MCA may include first and second horizontal conductive lines WL1 and WL2 of an asymmetrical structure.

FIGS. 5 to 15 are cross-sectional views illustrating a method for fabricating a semiconductor device in accordance with an embodiment of the present invention.

Figure 5:
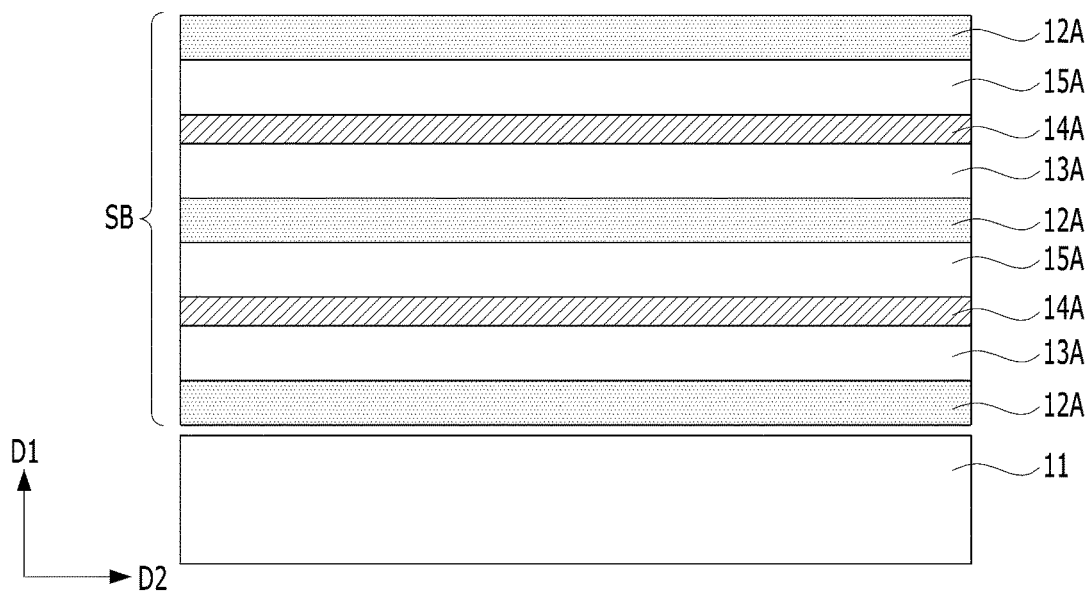
FIGS. 5 to 15 are cross-sectional views illustrating a method for fabricating a semiconductor device in accordance with an embodiment of the present invention.

Referring to FIG. 5, a stack body SB may be formed over a lower structure 11. In the stack body SB, a plurality of sub-stacks may be alternately stacked. In each sub-stack, a first sacrificial layer 13A, a semiconductor layer 14A, and a second sacrificial layer 15A may be sequentially stacked between two dielectric layers 12A. The dielectric layers 12A may include, for example, silicon oxide, and the first and second sacrificial layers 13A and 15A may include, for example, a silicon nitride-based material. The semiconductor layer 14A may include a semiconductor material or an oxide semiconductor material. The semiconductor layer 14A may include, for example, monocrystalline silicon, polysilicon, or indium gallium zinc oxide (IGZO). As described in the above-described embodiments of the present invention, when memory cells are stacked, the stack body SB may be formed by stacking several sub-stacks.

The first sacrificial layers 13A and the second sacrificial layers 15A may have an etch selectivity with respect to the dielectric layers 12A and the semiconductor layers 14A. The first sacrificial layers 13A and the second sacrificial layers 15A may have different etch rates. The first sacrificial layers 13A may include a material that may be etched faster than the second sacrificial layers 15A. The first sacrificial layers 13A may include a first sacrificial material, and the second sacrificial layers 15A may include a second sacrificial material. The first sacrificial material may be a material having a faster etch rate than the second sacrificial material. For example, the first sacrificial material may include first silicon nitride, and the second sacrificial material may include second silicon nitride, but the composition ratios of the first silicon nitride and the second silicon nitride may be different from each other. The first sacrificial material may include first silicon nitride, and the second sacrificial material may include second silicon nitride, and the first silicon nitride and the second silicon nitride may have different nitrogen composition ratios. The first sacrificial material may include a first silicon nitride, the second sacrificial material may include a second silicon nitride, and the first silicon nitride and the second silicon nitride may have different composition ratios of oxygen. The first sacrificial material may include a first silicon nitride, the second sacrificial material may include a second silicon nitride, and the first silicon nitride and the second silicon nitride may have different composition ratios of silicon.

The stack body SB may include a first dielectric layer disposed below the semiconductor layer 14A, a first sacrificial layer 13A between the first dielectric layer and the semiconductor layer 14A, a second dielectric layer disposed over the semiconductor layer 14A, and a second sacrificial layer 15A between the semiconductor layer 14A and the second dielectric layer. The first and second dielectric layers may correspond to the dielectric layers 12A.

Figure 6:
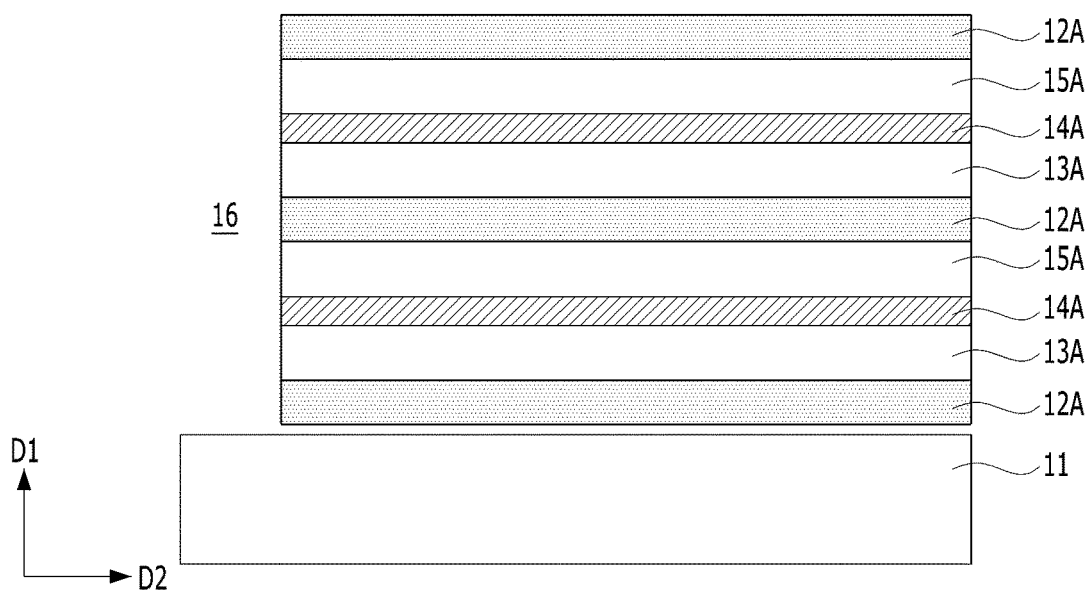

Referring to FIG. 6, a first opening 16 may be formed by etching a portion of the stack body SB. The first opening 16 may extend vertically from the surface of the lower structure 11. Before the first opening 16 is formed, as illustrated in FIGS. 1 to 4B, the stack body SB may be patterned on the basis of a memory cell unit.

Figure 7:
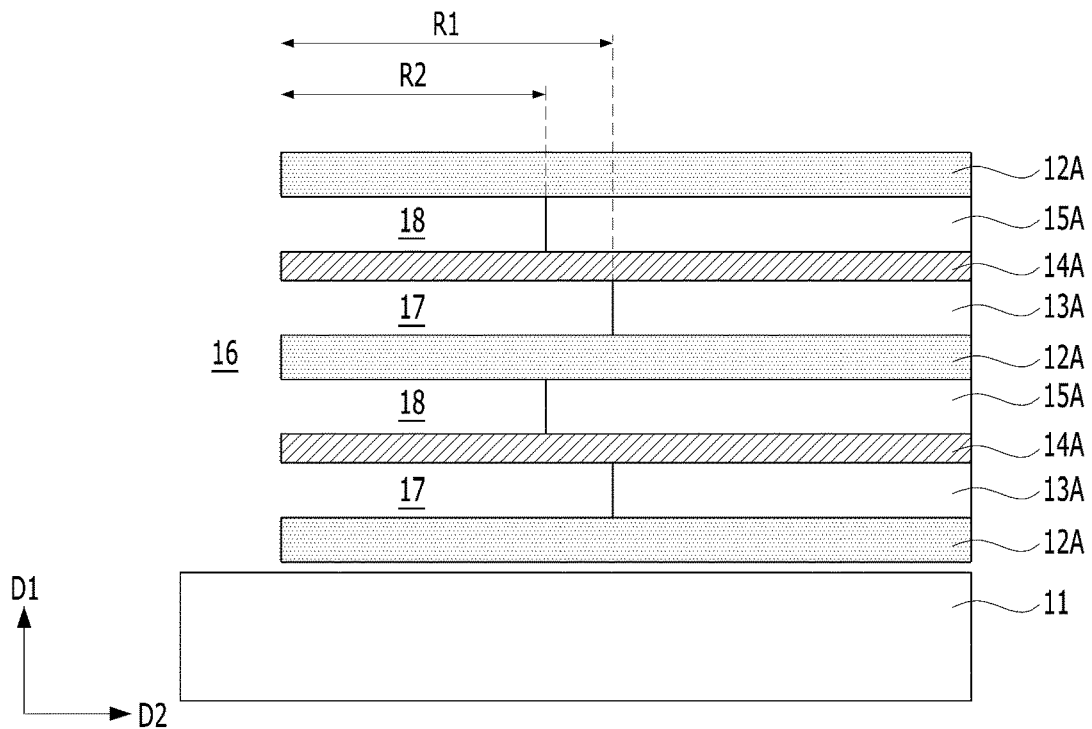

Referring to FIG. 7, lower recesses 17 and upper recesses 18 may be formed by selectively etching the first and second sacrificial layers 13A and 15A through the first opening 16. A portion of the semiconductor layer 14A may be asymmetrically exposed by the lower recesses 17 and the upper recesses 18. The lower recesses 17 and the upper recesses 18 may be disposed between the dielectric layers 12A and the semiconductor layers 14A and may have an asymmetrical structure. The lower recesses 17 may be formed by etching the first sacrificial layers 13A, and the upper recesses 18 may be formed by etching the second sacrificial layers 15A.

The lower recesses 17 and the upper recesses 18 may extend horizontally in the second direction D2. The horizontal length R1 of the lower recesses 17 may be greater than the horizontal length R2 of the upper recesses 18. The etching of the first and second sacrificial layers 13A and 15A may include wet etching. Since the wet etch rate of the first sacrificial layers 13A is faster than that of the second sacrificial layers 15A, the horizontal length R1 of the lower recesses 17 may be greater than the horizontal length R2 of the upper recesses 18. For example, when the first and second sacrificial layers 13A and 15A are silicon nitride having different composition ratios, wet etching using phosphoric acid may be performed. With respect to phosphoric acid, the first sacrificial layers 13A may be etched faster than the second sacrificial layers 15A.

Figure 8:
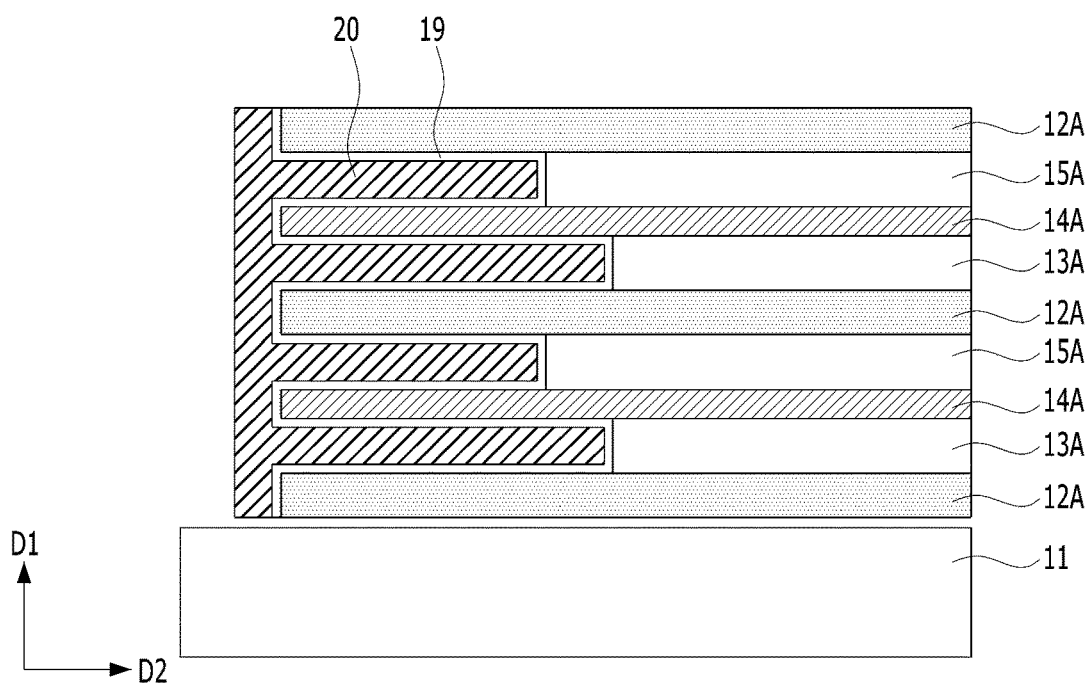

Referring to FIG. 8, a liner material 19, which is a thin dielectric material 19, may be formed over the exposed portions of the semiconductor layers 14A. The liner material 19 may include, for example, silicon oxide, silicon nitride, a metal oxide, a metal oxynitride, a metal silicate, a high-k material, a ferroelectric material, an anti-ferroelectric material, or a combination thereof. In some embodiments, the liner material 19 may include $SiO_2$, $Si_3N_4$, $HfO_2$, $Al_2O_3$, $ZrO_2$, AlON, HfON, HfSiO, HfSiON, and the like. The liner material 19 may be referred to as a gate dielectric material.

According to this embodiment of the present invention, the liner material 19 may be formed by a deposition process or an oxidation process.

Subsequently, a conductive material 20 filling the lower recesses 17 and the upper recesses 18 may be formed over the liner material 19. The conductive material 20 may include a high work function material. The conductive material 20 may include a metal-based material. In some embodiments, the conductive material 20 may include titanium nitride, tungsten, or a combination thereof.

Figure 9:
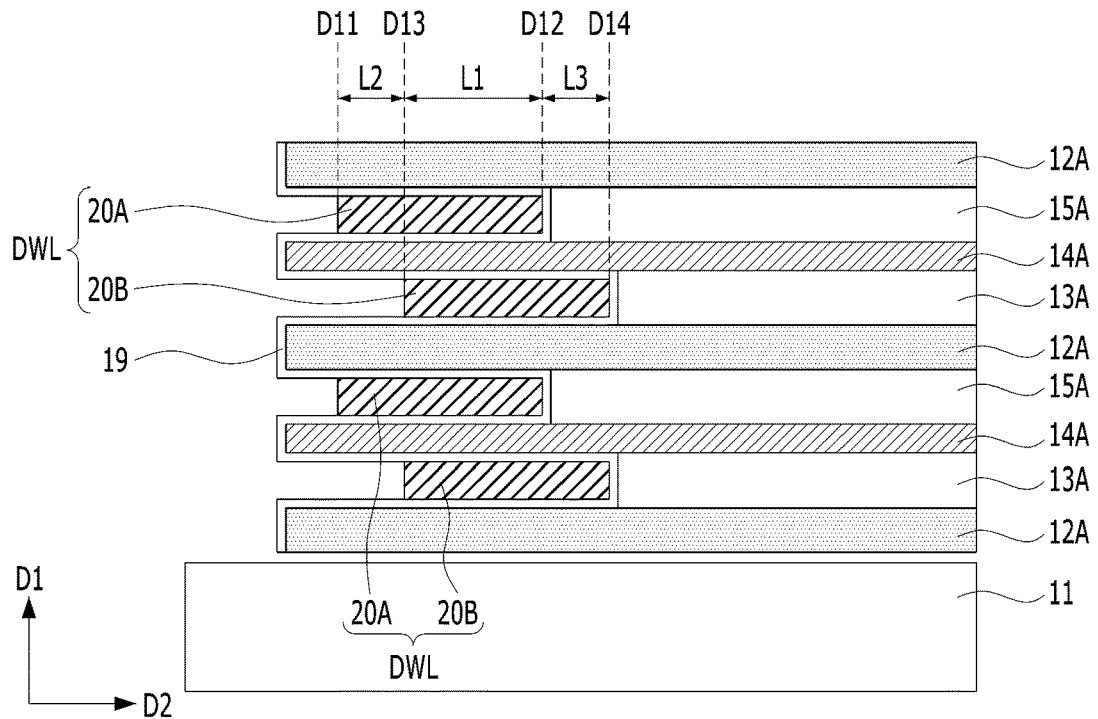

Referring to FIG. 9, horizontal conductive lines DWL of an asymmetrical double structure may be formed. Each of the horizontal conductive lines DWL may include an upper horizontal conductive line 20A and a lower horizontal conductive line 20B that partially fill the lower recesses 17 and the upper recesses 18, respectively. The upper horizontal conductive line 20A may fill the upper recess 18, and the lower horizontal conductive line 20B may fill the lower recess 17. The upper horizontal conductive line 20A may correspond to the first horizontal conductive line WL1 of the above-described embodiments, and the lower horizontal conductive line 20B may correspond to the second horizontal conductive line WL2 of the above-described embodiments.

In order to form the upper horizontal conductive line 20A and the lower horizontal conductive line 20B, the conductive material 20 may be selectively etched. For example, wet etching may be performed on the conductive material 20. The horizontal conductive line DWL may be referred to as a gate line or a word line.

The upper horizontal conductive line 20A and the lower horizontal conductive line 20B may face each other with the semiconductor layer 14A interposed therebetween.

As described above, the horizontal conductive line DWL may have an asymmetric double structure of the upper horizontal conductive line 20A and the lower horizontal conductive line 20B.

The horizontal conductive line DWL may include first to fourth side surfaces D11 to D14. The first side surface D11 and the second side surface D12 of the horizontal conductive line DWL may be disposed at a higher level than the semiconductor layer 14A, and the third side surface D13 and the fourth side surface D14 of the horizontal conductive line DWL may be disposed at a lower level than the semiconductor layer 14A. The first side surface D11 and the second side surface D12 of the horizontal conductive line DWL may face each other in the second direction D2. The third side surface D13 and the fourth side surface D14 of the horizontal conductive line DWL may face each other in the second direction D2. The first side surface D11 and the second side surface D12 of the horizontal conductive line DWL may be provided by the upper horizontal conductive line 20A, and the third side surface D13 and the fourth side surface D14 of the horizontal conductive line DWL may be provided by the lower horizontal conductive line 20B.

The upper horizontal conductive line 20A may include the first side surface D11 and the second side surface D12. The lower horizontal conductive line 20B may include the third side surface D13 and the fourth side surface D14. The upper horizontal conductive line 20A and the lower horizontal conductive line 20B may face each other in the first direction D1, and the upper horizontal conductive line 20A and the lower horizontal conductive line 20B may have an asymmetric structure with the semiconductor layer 14A interposed therebetween.

The upper horizontal conductive line 20A and the lower horizontal conductive line 20B may have the same horizontal length in the second direction D2. The upper horizontal conductive line 20A and the lower horizontal conductive line 20B may have the same vertical height in the first direction D1. The upper horizontal conductive line 20A may include a first overlap region L1 and a second overlap region L2 overlapping with the semiconductor layer 14A. The lower horizontal conductive line 20B may include a first overlap region L1 and a third overlap region L3 overlapping with the semiconductor layer 14A. In the first overlap region L1, the upper horizontal conductive line 20A and the lower horizontal conductive line 20B may overlap with the semiconductor layer 14A in common. In the second overlap region L2, the upper horizontal conductive line 20A and the semiconductor layer 14A may overlap, and in the third overlap region L3, the lower horizontal conductive line 20B and the semiconductor layer 14A may overlap. In the second overlap region L2, the lower horizontal conductive line 20B and the semiconductor layer 14A may not overlap, and in the third overlap region L3, the upper horizontal conductive line 20A and the semiconductor layer 14A may not overlap.

The first liner layer 19A may cover a portion of the upper horizontal conductive line 20A, and the second liner layer 19B may cover a portion of the lower horizontal conductive line 20B.

The upper horizontal conductive line 20A may correspond to the first horizontal conductive line WL1 as illustrated in FIGS. 4A to 4C. The lower horizontal conductive line 20B may correspond to the second horizontal conductive line WL2 as illustrated in FIGS. 4A to 4C. According to another embodiment of the present invention, when the etch rate of the second sacrificial layers 15B is faster than that of the first sacrificial layers 13A, the first horizontal conductive line WL1 and the second horizontal conductive line WL2 as illustrated in FIGS. 1 to 3B may be formed.

Figure 10:
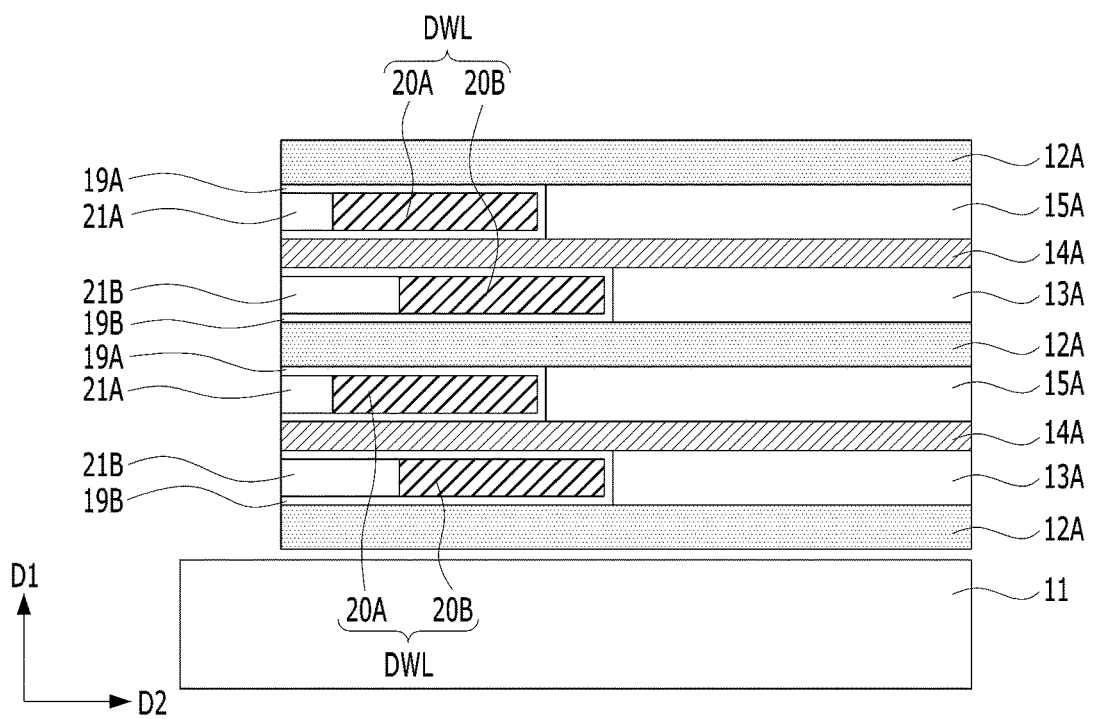

Referring to FIG. 10, first capping layers 21A and 21B filling the remaining portions of the lower recesses 17 and the upper recesses 18 may be formed over the upper and lower horizontal conductive lines 20A and 20B. The first capping layers 21A and 21B may include a dielectric material. The first capping layers 21A and 21B may include, for example, silicon oxide, silicon nitride, or a combination thereof. The first capping layers 21A and 21B may include upper first capping layers 21A and lower first capping layers 21B. The upper first capping layers 21A may contact or directly contact the upper horizontal conductive lines 20A, and the lower first capping layers 21B may contact or directly contact the lower horizontal conductive lines 20B. The horizontal lengths of the upper first capping layers 21A in the second direction D2 may be smaller than the horizontal lengths of the lower first capping layers 21B.

After the first capping layers 21A and 21B are formed, a portion of the liner material 19 may be etched to expose a first-side surface of the semiconductor layer 14A. As a result of etching the liner material 19, the first liner layer 19A and the second liner layer 19B may be formed. The first liner layer 19A may cover the upper horizontal conductive line 20A and the upper first capping layers 21A. The second liner layer 19B may cover the lower horizontal conductive line 20B and the lower first capping layers 21B. The horizontal lengths of the first liner layers 19A may be smaller than the horizontal lengths of the second liner layers 19B. The first liner layer 19A and the second liner layer 19B may be referred to as a first gate dielectric layer and a second gate dielectric layer, respectively. The first liner layer 19A and the second liner layer 19B may have a horizontally oriented cup shape.

Figure 11:
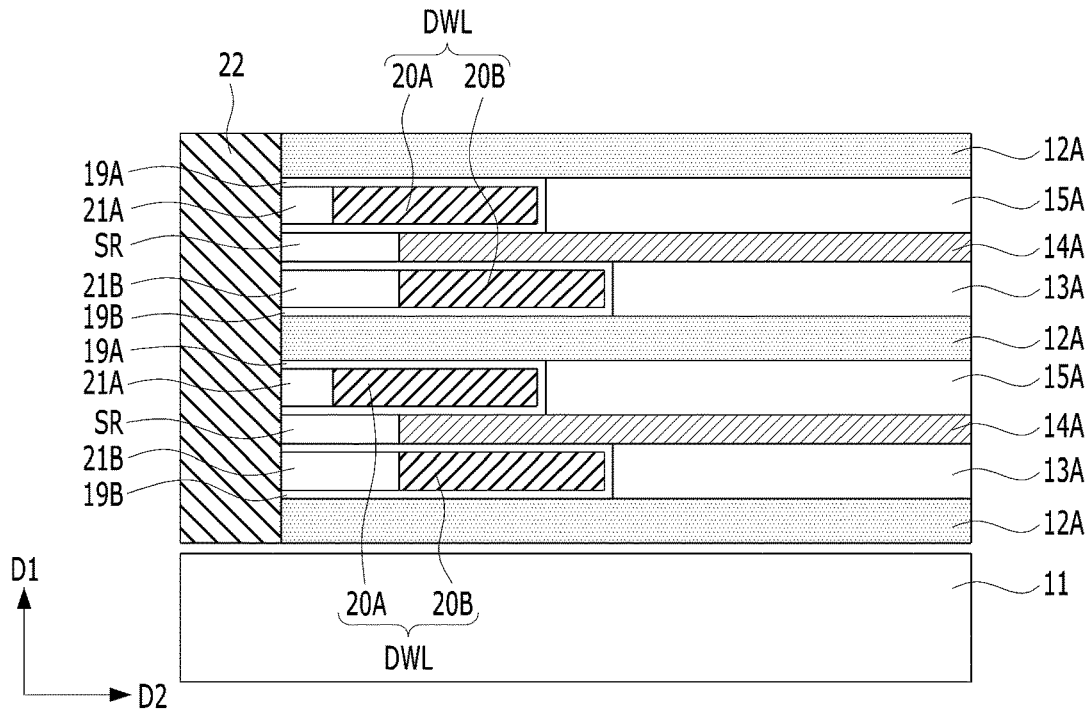

Referring to FIG. 11, a vertical conductive line 22 filling the first opening 16 may be formed.

The vertical conductive line 22 may be coupled to a first-side end of each of the semiconductor layers 14A. The vertical conductive line 22 may, for example, include titanium nitride, tungsten, or a combination thereof.

Before the vertical conductive line 22 is formed, a first doped region SR may be formed in the first-side end of the semiconductor layer 14A. The first doped region SR may be formed by an impurity doping process. The first doped region SR may be referred to as a first source/drain region. The first doped region SR may overlap with a portion of the upper horizontal conductive line 20A. The first doped region SR may not overlap with the lower horizontal conductive line 20B.

According to another embodiment of the present invention, after filling the first opening 16 with polysilicon containing an impurity, a subsequent heat treatment may be performed to diffuse the impurity from the polysilicon to the first-side end of the semiconductor layer 14A. Accordingly, the first doped region SR may be formed in the first-side end of the semiconductor layer 14A. After the subsequent heat treatment, the polysilicon may be removed.

According to another embodiment of the present invention, before the vertical conductive line 22 is formed, a first ohmic contact coupled to the first-side end of the semiconductor layer 14A may be formed. The first ohmic contact may include a metal silicide. For example, a metal silicide may be formed by sequentially performing a metal layer deposition process and an annealing process, and the unreacted metal layer may be removed. The metal silicide may be formed by reacting silicon of the semiconductor layer 14A with the metal layer.

Figure 12:
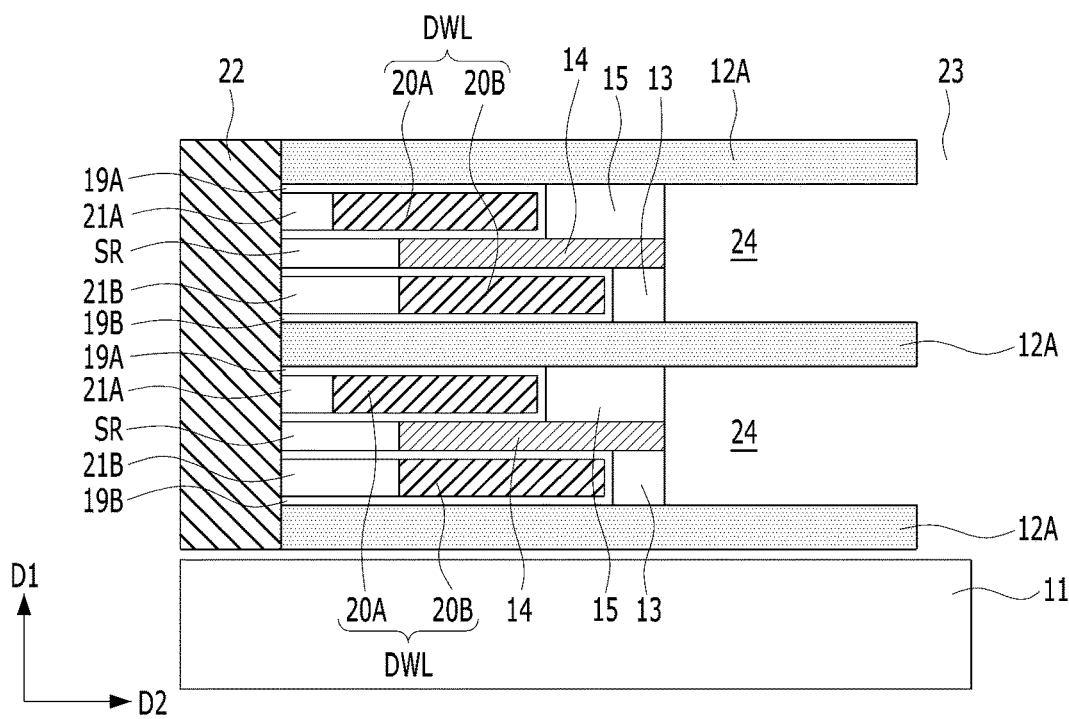

Referring to FIG. 12, a second opening 23 may be formed by etching another portion of the stack body SB. The second opening 23 may extend vertically from the surface of the lower structure 11.

Subsequently, the first and second sacrificial layers 13A and 15A and the semiconductor layer 14A may be selectively recessed through the second opening 23. Accordingly, wide openings 24 may be formed between the dielectric layers 12A. The semiconductor layer 14A may remain as a horizontal layer 14 as denoted by a reference numeral '14', and a second-side end of the horizontal layer 14 may be exposed by the wide opening 24. Second capping layers 13 and 15 may be formed by the selective recess process of the first and second sacrificial layers 13A and 15A, respectively. The second capping layers 13 and 15 may include upper second capping layers 15 and lower second capping layers 13. The horizontal lengths of the upper second capping layers 15 in the second direction D2 may be greater than the horizontal lengths of the lower second capping layers 13. The horizontal lengths of the upper second capping layers 15 and the horizontal lengths of the lower first capping layers 21B may be the same. The horizontal lengths of the upper first capping layers 21A and the horizontal lengths of the lower second capping layers 13 may be the same.

Figure 13:
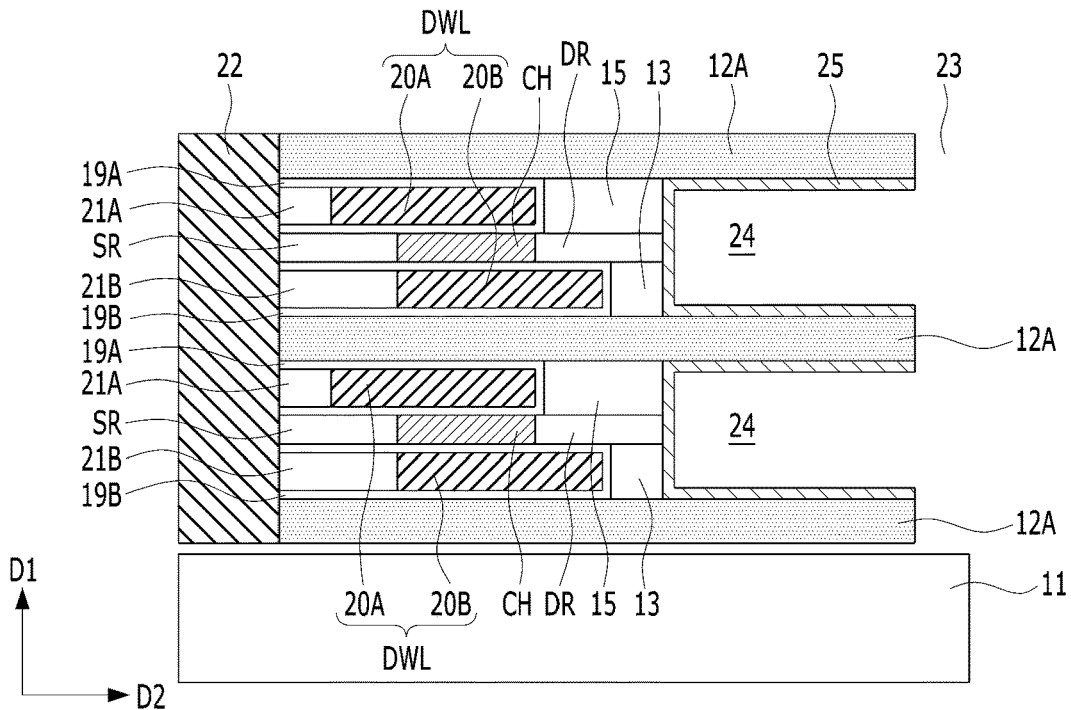

Referring to FIG. 13, a first electrode 25 contacting the second-side ends of the horizontal layers 14 may be formed. The first electrode 25 may be formed by depositing a conductive material and performing an etch-back process. The first electrode 25 may include, for example, titanium nitride. The first electrode 25 may have a horizontally oriented cylindrical shape.

Before forming the first electrode 25, a second doped region DR may be formed in the second-side end of the horizontal layer 14. The second doped region DR may be formed by an impurity doping process. The second doped region DR may be referred to as a second source/drain region. The second doped region DR may overlap with a portion of the lower horizontal conductive line 20B. The second doped region DR may not overlap with the upper horizontal conductive line 20A.

According to another embodiment of the present invention, after filling the second opening 23 and the wide openings 24 with polysilicon containing an impurity, a subsequent heat treatment may be performed to diffuse the impurity from the polysilicon to the second-side end of the horizontal layers 14. Accordingly, the second doped region DR may be formed in the second-side end of the horizontal layers 14. After the subsequent heat treatment, the polysilicon may be removed.

After the second doped region DR is formed, a channel CH may be defined in the horizontal layers 14. The channel CH may be defined between the first doped region SR and the second doped region DR.

As described above, the first doped region SR, the channel CH, and the second doped region DR may be formed in each horizontal layer 14.

According to another embodiment of the present invention, a second ohmic contact coupled to the second-side end of the horizontal layer 14, i.e., the second doped region DR, may be formed. The second ohmic contact may include a metal silicide. For example, a metal silicide may be formed by sequentially performing metal layer deposition and annealing processes, and the unreacted metal layer may be removed. The metal silicide may be formed by reacting silicon of the horizontal layers 14 with the metal layer.

Figure 14:
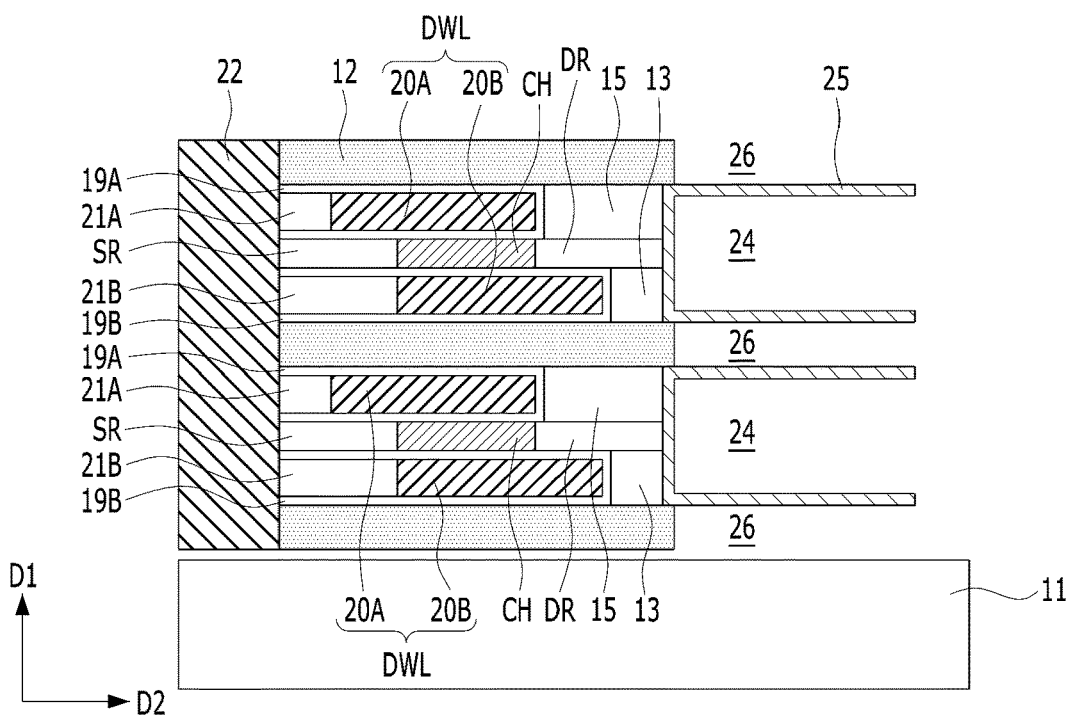

Referring to FIG. 14, the dielectric layers 12A may be partially recessed to form a partial recessed portion 26. Accordingly, the inner and outer walls of the first electrodes 25 may be exposed. The remaining dielectric layers 12 may contact or directly contact the horizontal conductive line DWL. The remaining dielectric layers 12 may be referred to as cell separation layers.

Figure 15:
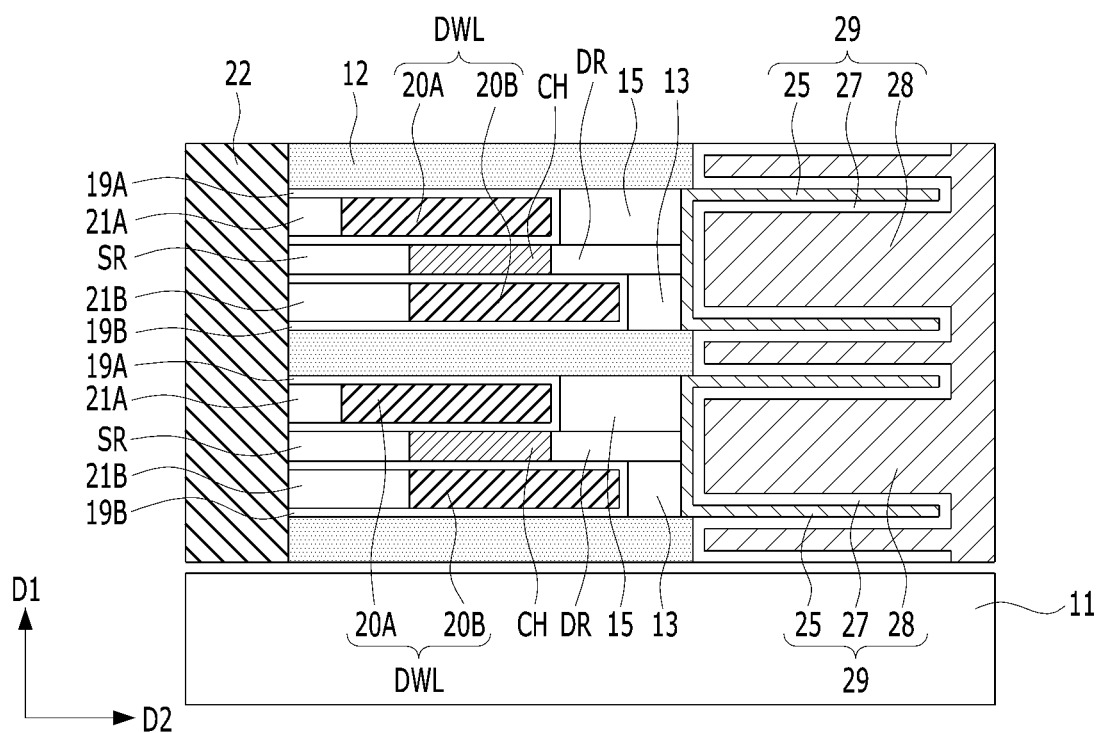

Referring to FIG. 15, a dielectric layer 27 and a second electrode 28 may be sequentially formed over the first electrodes 25. The first electrode 25, the dielectric layer 27 and the second electrode 28 may form a data storage element 29.

According to the embodiment of the present invention, the problem of leakage current may be improved by forming a horizontal conductive line of an asymmetrical double structure, and power consumption may be reduced by securing refresh characteristics.

According to another embodiment of the present invention, which is relatively advantageous for increasing an electric field that is formed when the thickness of a horizontal layer is reduced for high integration, high integration may be achieved by realizing a high number of stacked layers.

According to the embodiment of the present invention, it is possible to achieve low power consumption and high integration of a 3D memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
 a horizontal layer spaced apart from a lower structure to extend in a direction parallel to the lower structure;
 a vertical conductive line extending in a direction perpendicular to the lower structure and coupled to a first-side end of the horizontal layer;
 a data storage element coupled to a second-side end of the horizontal layer; and
 a horizontal conductive line including a first horizontal conductive line and a second horizontal conductive line that are vertically asymmetrical with the horizontal layer interposed therebetween.

2. The semiconductor device of claim 1, wherein the first horizontal conductive line includes a first side surface disposed adjacent to the vertical conductive line, and a second side surface disposed adjacent to the data storage element, and
 a distance between the first side surface and the vertical conductive line is smaller than a distance between the second side surface and the data storage element.

3. The semiconductor device of claim 2, wherein the second horizontal conductive line includes a third side surface disposed adjacent to the vertical conductive line and a fourth side surface disposed adjacent to the data storage element, and
 a distance between the third side surface and the vertical conductive line is greater than a distance between the fourth side surface and the data storage element.

4. The semiconductor device of claim 1, wherein the horizontal layer includes:
 a first doped region;
 a second doped region; and
 a channel between the first doped region and the second doped region.

5. The semiconductor device of claim 4, wherein each of the first horizontal conductive line and the second horizontal conductive line includes a first overlap region overlapping with the channel.

6. The semiconductor device of claim 5, wherein the first horizontal conductive line further includes a second overlap region overlapping with the first doped region,
 wherein the second overlap region does not overlap with the second horizontal conductive line.

7. The semiconductor device of claim 5, wherein the second horizontal conductive line further includes a third overlap region overlapping with the second doped region,
 wherein the third overlap region does not overlap with the first horizontal conductive line.

8. The semiconductor device of claim 1, wherein the first and second horizontal conductive lines include a high work function material.

9. The semiconductor device of claim 1, further comprising:
 an upper first capping layer between the first horizontal conductive line and the vertical conductive line; and
 a lower first capping layer between the second horizontal conductive line and the vertical conductive line.

10. The semiconductor device of claim 9, wherein a horizontal length of the upper first capping layer is smaller than a horizontal length of the lower first capping layer.

11. The semiconductor device of claim 1, further comprising:
 an upper second capping layer between the first horizontal conductive line and the data storage element; and
 a lower second capping layer between the second horizontal conductive line and the data storage element.

12. The semiconductor device of claim 11, wherein a horizontal length of the upper second capping layer is greater than a horizontal length of the lower second capping layer.

13. The semiconductor device of claim 1, wherein the horizontal layer has a smaller vertical thickness than the first and second horizontal conductive lines.

14. The semiconductor device of claim 1, wherein the horizontal layer includes a semiconductor material or an oxide semiconductor material.

15. The semiconductor device of claim 1, wherein the horizontal layer includes monocrystalline silicon, polysilicon, germanium, silicon-germanium, or indium gallium zinc oxide (IGZO).

16. The semiconductor device of claim 1, wherein the data storage element includes a capacitor, and
 the capacitor includes a cylindrical first electrode, a second electrode, and a dielectric layer between the first electrode and the second electrode.

* * * * *